United States Patent
Kim et al.

(10) Patent No.: US 11,348,924 B2
(45) Date of Patent: May 31, 2022

(54) SEMICONDUCTOR MEMORY DEVICE

(71) Applicant: Samsung Electronics Co., Ltd., Suwon-si (KR)

(72) Inventors: Jae Hoon Kim, Seoul (KR); Kwang-Ho Park, Cheonan-si (KR); Yong-Hoon Son, Yongin-si (KR); Hyunji Song, Anyang-si (KR); Gyeonghee Lee, Hwaseong-si (KR); Seungjae Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 13 days.

(21) Appl. No.: 16/923,572

(22) Filed: Jul. 8, 2020

(65) Prior Publication Data
US 2021/0125991 A1   Apr. 29, 2021

(30) Foreign Application Priority Data

Oct. 28, 2019   (KR) .......................... 10-2019-0134616

(51) Int. Cl.
*G11C 5/06* (2006.01)
*H01L 27/108* (2006.01)
*G11C 11/4097* (2006.01)

(52) U.S. Cl.
CPC .... *H01L 27/10805* (2013.01); *G11C 11/4097* (2013.01)

(58) Field of Classification Search
CPC ....................... H01L 27/10805; G01C 11/4097
USPC ........................................................ 365/63
See application file for complete search history.

(56) References Cited

U.S. PATENT DOCUMENTS

| | | | | |
|---|---|---|---|---|
| 6,930,014 B2* | 8/2005 | Kim | .................. | H01L 27/10817 438/396 |
| 7,094,660 B2* | 8/2006 | Park | .................. | H01L 27/10817 438/386 |
| 7,145,196 B2* | 12/2006 | Hur | .................. | H01L 27/10873 257/296 |
| 7,247,541 B2* | 7/2007 | Lee | .................. | H01L 27/10823 438/286 |
| 7,326,613 B2* | 2/2008 | Yun | .................. | H01L 21/76829 438/244 |
| 7,482,222 B2* | 1/2009 | Lee | .................. | H01L 27/10888 438/253 |
| 7,605,409 B2* | 10/2009 | Ahn | ................ | H01L 21/823475 257/211 |
| 7,892,918 B2* | 2/2011 | Lee | .................. | H01L 27/10888 438/253 |

(Continued)

FOREIGN PATENT DOCUMENTS

KR   10-2021-0022234 A   3/2021

*Primary Examiner* — Viet Q Nguyen
(74) *Attorney, Agent, or Firm* — Harness, Dickey & Pierce, P.L.C.

(57) ABSTRACT

A semiconductor memory device may include a bit line extending in a first direction, a first conductive pattern extending in a second direction intersecting the first direction, a semiconductor pattern connecting the bit line and the first conductive pattern, a second conductive pattern including an insertion portion in the first conductive pattern, and a dielectric layer between the first conductive pattern and the second conductive pattern. The insertion portion of the second conductive pattern may have a width which increases as a distance from the semiconductor pattern increases.

20 Claims, 31 Drawing Sheets

(56) References Cited

U.S. PATENT DOCUMENTS

| | | | |
|---|---|---|---|
| 8,143,692 B2 | 3/2012 | Jang et al. | |
| 8,362,336 B1* | 1/2013 | Piper | A01H 5/10 |
| | | | 800/320.1 |
| 9,117,696 B2* | 8/2015 | Kim | G11C 11/4099 |
| 10,121,793 B2* | 11/2018 | Kim | H01L 27/10876 |
| 10,468,103 B2* | 11/2019 | Kim | H01L 27/222 |
| 10,644,003 B2* | 5/2020 | Cho | H01L 27/10876 |
| 10,784,272 B2* | 9/2020 | Lee | H01L 23/53295 |
| 10,825,819 B2* | 11/2020 | Kim | H01L 27/10888 |
| 10,841,527 B2* | 11/2020 | Park | H01L 27/10897 |
| 10,854,612 B2* | 12/2020 | Cho | H01L 27/10885 |
| 2011/0147889 A1* | 6/2011 | Tsuchiya | H01L 27/10885 |
| | | | 257/532 |
| 2011/0233631 A1 | 9/2011 | Son et al. | |
| 2013/0148400 A1* | 6/2013 | Murooka | G11C 13/004 |
| | | | 365/63 |
| 2014/0175371 A1 | 6/2014 | Karpov et al. | |
| 2019/0103407 A1* | 4/2019 | Kim | H01L 28/86 |
| 2019/0140087 A1 | 5/2019 | Liu et al. | |
| 2019/0164985 A1* | 5/2019 | Lee | H01L 27/1085 |

* cited by examiner

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2019-0134616, filed on Oct. 28, 2019, in the Korean Intellectual Property Office, the disclosure of which is hereby incorporated by reference in its entirety.

BACKGROUND

Example embodiments of the inventive concepts relate to a semiconductor memory device and, more particularly, to a three-dimensional (3D) semiconductor memory device with improved integration density.

Semiconductor devices have been highly integrated to provide improved performance and/or lower manufacturing costs. The integration density of semiconductor devices affects the costs of the semiconductor devices, thereby resulting in a demand of more highly integrated semiconductor devices. The integration density of typical two-dimensional (2D) or planar semiconductor devices may be mainly determined by an area where a unit memory cell occupies. Therefore, the integration density of the typical 2D semiconductor devices may be affected by a technique of forming fine patterns. However, since higher-priced apparatuses are needed to form finer patterns, the integration density of 2D semiconductor devices continues to increase but is still limited. Thus, three-dimensional (3D) semiconductor memory devices have been developed. 3D semiconductor memory devices may include memory cells three-dimensionally arranged.

SUMMARY

Example embodiments of the inventive concepts may provide a semiconductor memory device capable of improving electrical characteristics and/or reliability.

In an aspect, a semiconductor memory device may include a bit line extending in a first direction, a first conductive pattern extending in a second direction intersecting the first direction, a semiconductor pattern connecting the bit line and the first conductive pattern, a second conductive pattern including an insertion portion in the first conductive pattern, and a dielectric layer between the first conductive pattern and the second conductive pattern. The insertion portion of the second conductive pattern may have a width which increases as a distance from the semiconductor pattern increases.

In an aspect, a semiconductor memory device may include first insulating patterns vertically stacked on a substrate, semiconductor patterns between the first insulating patterns and arranged in a first direction, the semiconductor patterns extending in a second direction intersecting the first direction, a bit line electrically connected to first ends of the semiconductor patterns, first conductive patterns on second ends of the semiconductor patterns, respectively, a second conductive pattern including portions in the first conductive patterns, and a dielectric layer between the first conductive patterns and the second conductive pattern. Each of the first conductive patterns may have a width in the first direction, which increases as a distance from each of the semiconductor patterns increases.

In an aspect, a semiconductor memory device may include a stack structure including a plurality of layers vertically stacked on a substrate, each layer including a bit line extending in a first direction, semiconductor patterns extending from the bit line in a second direction intersecting the first direction, and a first insulating pattern under the semiconductor patterns, gate electrodes extending in a third direction intersecting the first and second directions and on both side surfaces of the semiconductor pattern, a second insulating pattern filling a space between the semiconductor patterns and covering the gate electrodes, first conductive patterns electrically connected to the semiconductor patterns, respectively, and a second conductive pattern spaced apart from the first conductive patterns with a dielectric layer therebetween. Each of the first conductive patterns may have a width which increases as a distance from each of the semiconductor patterns increases.

In an aspect, a method for manufacturing a semiconductor memory device may include forming a stack structure including semiconductor patterns extending in a first direction and an insulating pattern surrounding the semiconductor patterns on a substrate, the stack structure having a first surface including ends of the semiconductor patterns, reducing lengths of the semiconductor patterns in the first direction to form recess regions recessed from the first surface in the first direction, and forming a first conductive pattern, a second conductive pattern and a dielectric layer between the first and second conductive patterns in each of the recess regions. The formation of the recess regions may include repeatedly performing a first etching process of etching the semiconductor patterns and a second etching process of etching the insulating pattern.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
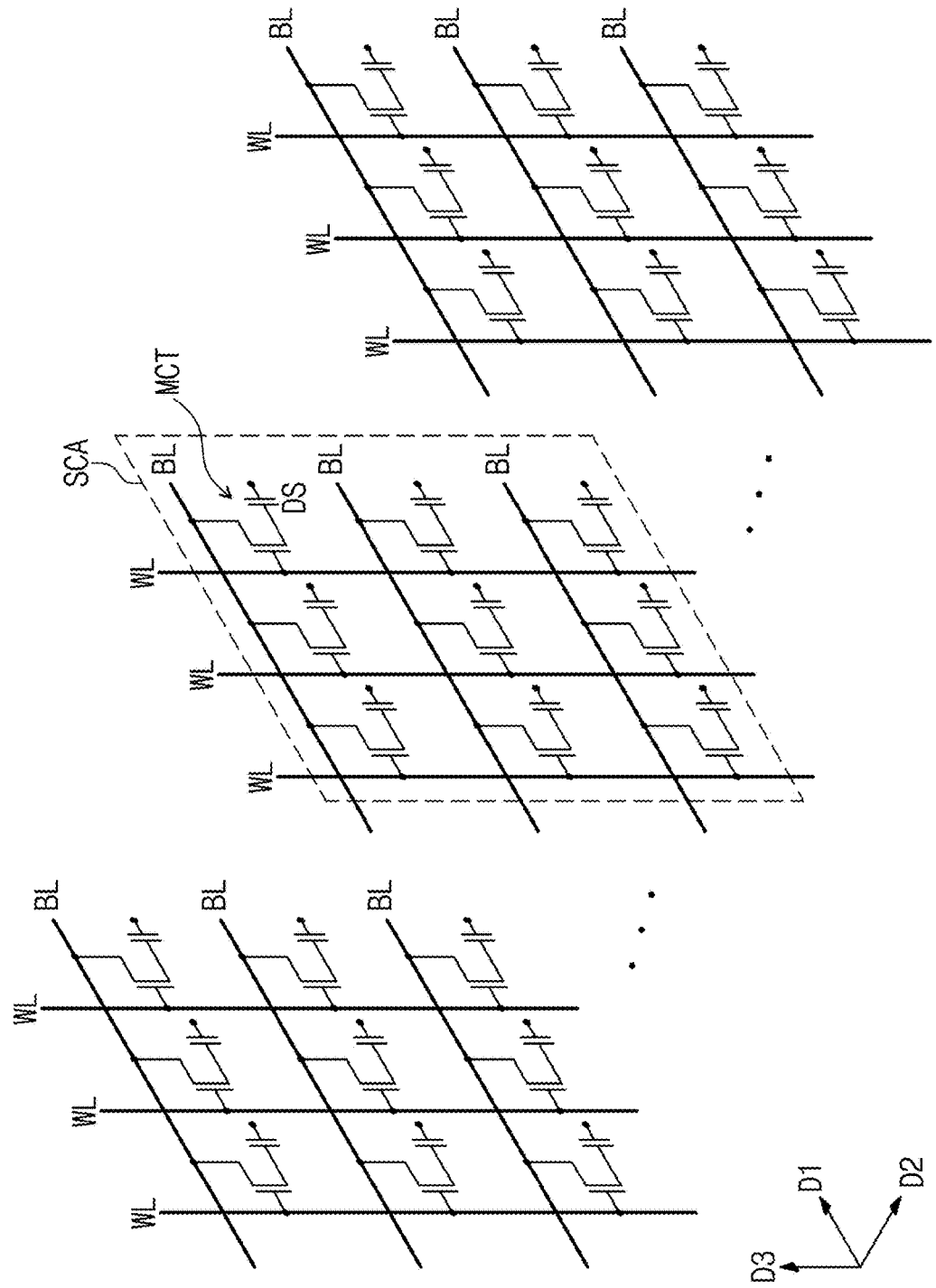
FIG. 1 is a schematic circuit diagram illustrating a cell array of a semiconductor memory device according to some example embodiments of the inventive concepts.

FIG. 1 is a schematic circuit diagram illustrating a cell array of a semiconductor memory device according to some example embodiments of the inventive concepts.

Referring to FIG. 1, a memory cell array of a semiconductor memory device according to some example embodiments of the inventive concepts may include a plurality of sub-cell arrays SCA. The sub-cell arrays SCA may be arranged in a second direction D2.

Each of the sub-cell arrays SCA may include a plurality of bit lines BL, a plurality of word lines WL, and/or a plurality of memory cell transistors MCT. Each of the memory cell transistors MCT may be connected between a corresponding one of the word lines WL and a corresponding one of the bit lines BL.

The bit lines BL may be conductive patterns (e.g., metal lines) vertically spaced apart from a substrate. The bit lines BL may extend in a first direction D1. The bit lines BL in each of the sub-cell arrays SCA may be spaced apart from each other in a vertical direction (e.g., a third direction D3).

The word lines WL may be conductive patterns (e.g., metal lines) extending from the substrate in the vertical direction (e.g., the third direction D3). The word lines WL in each of the sub-cell arrays SCA may be spaced apart from each other in the first direction D1.

A gate of the memory cell transistor MCT may be connected to the word line WL, and a source of the memory cell transistor MCT may be connected to the bit line BL. A data storage element DS may be connected to each of the memory cell transistors MCT. For example, the data storage element DS may be a capacitor, and a drain of the memory cell transistor MCT may be connected to the capacitor.

Figure 2:
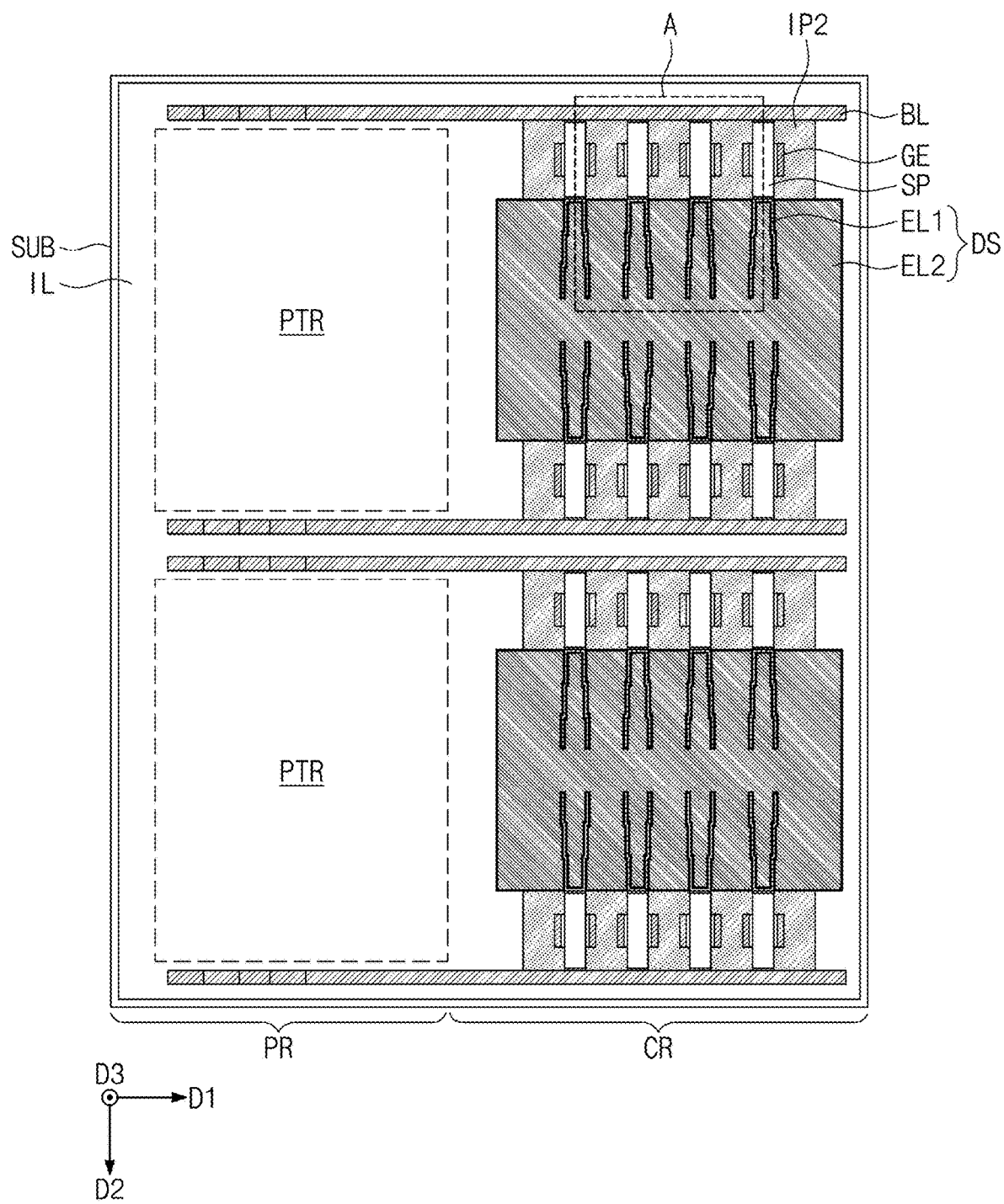
FIG. 2 is a plan view illustrating a semiconductor memory device according to some example embodiments of the inventive concepts.

FIG. 2 is a plan view illustrating a semiconductor memory device according to some example embodiments of the inventive concepts.

Referring to FIGS. 1 and 2, a semiconductor memory device may include a memory cell region CR and a peripheral circuit region PR. The memory cell arrays described with reference to FIG. 1 may be disposed in the memory cell region CR. Peripheral transistors PTR may be disposed in the peripheral circuit region PR. The peripheral transistors PTR may be connected to the memory cell arrays through bit lines BL. The peripheral transistors PTR may include, for example, sense amplifiers.

The bit lines BL may extend from the memory cell region CR into the peripheral circuit region PR. The bit lines BL may extend in the first direction D1 and may have different lengths. For example, the bit lines BL may have a staircase structure in the peripheral circuit region PR. Each of the bit lines BL may be disposed on ends of semiconductor patterns SP disposed at the same vertical level. The bit lines BL may be the bit lines BL described with reference to FIG. 1.

The semiconductor patterns SP may extend in the second direction D2. For example, the semiconductor patterns SP may include silicon, germanium, or silicon-germanium. Each of the semiconductor patterns SP may include source/drain regions and a channel region between the source/drain regions. Gate electrodes GE may be disposed on side surfaces of the semiconductor patterns SP. The semiconductor patterns SP and the gate electrodes GE may constitute the memory cell transistors MCT described with reference to FIG. 1.

Data storage elements DS may be connected to other ends of the semiconductor patterns SP, respectively. The data storage elements DS may include first conductive patterns EL1 and a second conductive pattern EL2 on the first conductive patterns EL1. The first conductive patterns may extend in the second direction and may be arranged in the first and third directions. The second conductive pattern EL2 may be adjacent to the first conductive patterns EL1. A dielectric layer may be disposed between the first conductive patterns EL1 and the second conductive pattern EL2. The data storage elements DS may be capacitors and may function as memory elements capable of storing data.

Figure 3:
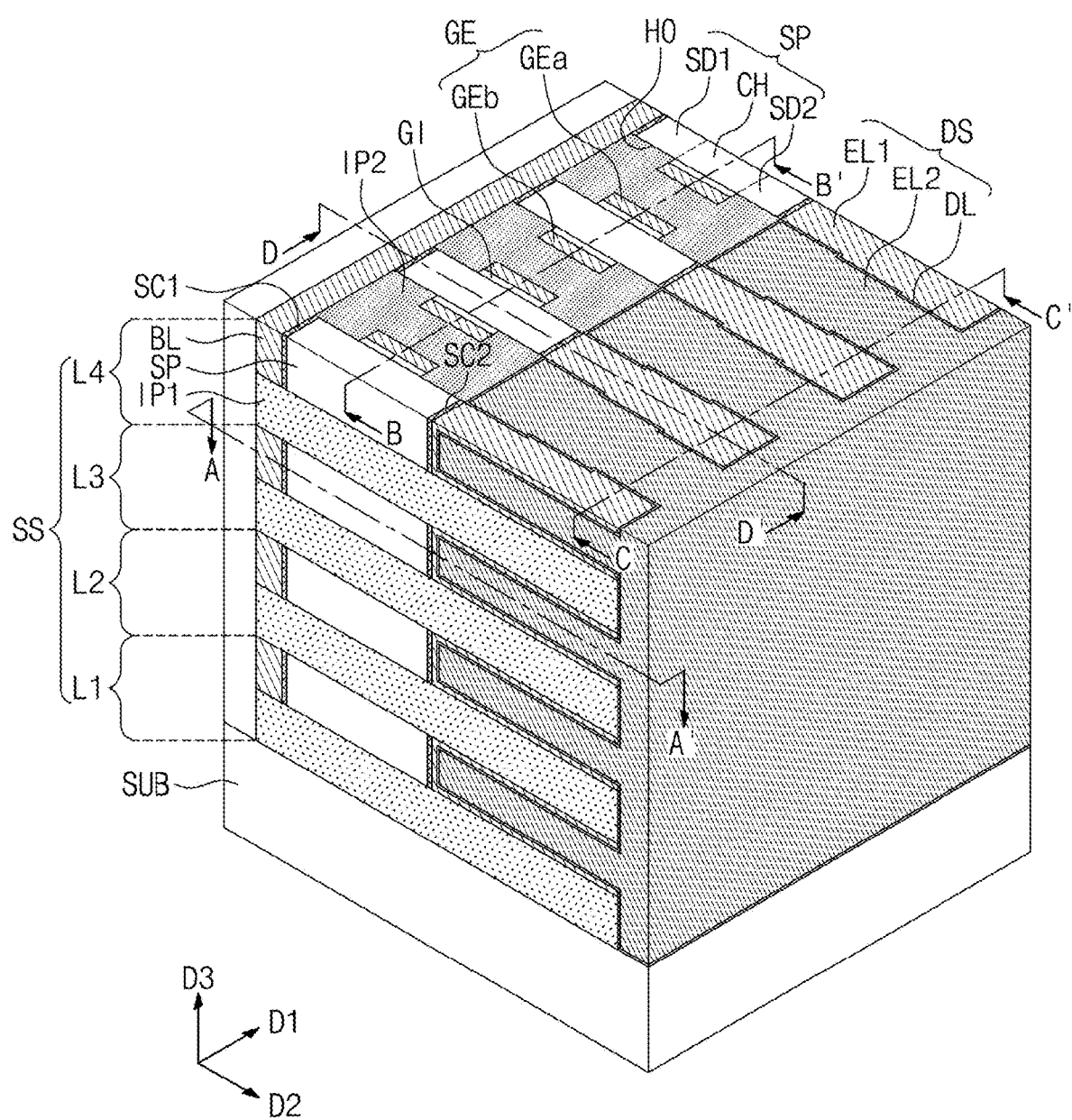
FIG. 3 is a perspective view corresponding to a portion 'A' of FIG. 2 to illustrate a semiconductor memory device according to some example embodiments of the inventive concepts.

FIG. 3 is a perspective view corresponding to a portion 'A' of FIG. 2 to illustrate a semiconductor memory device according to some example embodiments of the inventive concepts. FIGS. 4A, 4B, 4C and 4D are cross-sectional views taken along lines A-A', B-B', C-C' and D-D' of FIG. 3, respectively. FIGS. 5A to 5D are enlarged views corresponding to a portion 'A' of FIG. 4A to illustrate semiconductor memory devices according to some example embodiments of the inventive concepts.

Referring to FIGS. 3 and 4A to 4D, in detail, a stack structure SS may be provided on a substrate SUB. In some example embodiments, the stack structure SS may include a plurality of layers L1, L2, L3 and L4 stacked on the substrate SUB. Hereinafter, the semiconductor memory device including four layers will be described as an example. However, in some example embodiments, the semiconductor memory device may include the layers, the number of which is more or less than four. For an example, third and fourth layers L3 and L4 among first to fourth layers L1, L2, L3 and L4 may be omitted. For another example, other layers may be stacked on the fourth layer L4.

The first to fourth layers L1, L2, L3 and L4 of the stack structure SS may be stacked in a direction (e.g., the third direction D3) vertical to the substrate SUB. Each of the first to fourth layers L1, L2, L3 and L4 may include the bit line BL, first insulating patterns IP1, the semiconductor patterns SP, and the data storage elements DS.

The first insulating patterns IP1 may be stacked to be spaced apart from each other in the third direction. The semiconductor pattern SP and the bit line BL may be provided on each of the first insulating patterns IP1. The semiconductor pattern SP and the bit line BL may be disposed side by side on the first insulating pattern IP1. The first insulating pattern IP1 may vertically separate the semiconductor pattern SP and the bit line BL disposed thereon from the semiconductor pattern SP and the bit line BL disposed thereunder. The first insulating pattern IP1 may include at least one of silicon oxide, silicon nitride, silicon oxynitride, carbon-containing silicon oxide, carbon-containing silicon nitride, or carbon-containing silicon oxynitride. For example, the first insulating pattern IP1 may include silicon nitride (SiN). The first insulating pattern IP1 may extend in the second direction D2.

The bit line BL of each of the first to fourth layers L1 to L4 may extend in the first direction D1. The bit line BL may be located at the same level as the semiconductor pattern SP. One side surface of the bit line BL may face one end of the semiconductor pattern SP. Each of the bit lines BL may have a line or bar shape extending in the first direction D1. The bit lines BL may be stacked in the third direction D3 and may be spaced apart from each other in the third direction D3. The bit lines BL may include a conductive material. For example, the conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

The semiconductor pattern SP may be provided in plurality in each of the first to fourth layers L1 to L4. The plurality of semiconductor patterns SP in each of the layers L1 to L4 may be arranged in the first direction D1. Each of the semiconductor patterns SP may have a line, bar or pillar shape extending in the second direction D2. For example, the semiconductor patterns SP may include silicon, germanium, or silicon-germanium. Each of the semiconductor patterns SP may include a channel region CH, a first dopant region SD1, and a second dopant region SD2. The channel region CH may be disposed between the first and second dopant regions SD1 and SD2. The bit line BL may be electrically connected to the first dopant region SD1 of the semiconductor pattern SP.

The channel region CH may be disposed between the first and second dopant regions SD1 and SD2. The channel region CH may correspond to a channel of the memory cell transistor MCT described with reference to FIG. 1. The first and second dopant regions SD1 and SD2 may correspond to the source and the drain of the memory cell transistor MCT described with reference to FIG. 1.

The first and second dopant regions SD1 and SD2 may be regions of the semiconductor pattern SP, which are doped with dopants. Thus, the first and second dopant regions SD1 and SD2 may have an N-type or P-type conductivity type. The first dopant region SD1 may be one of a source region and a drain region, and the second dopant region SD2 may be the other of the source region and the drain region. In some example embodiments, the first dopant region SD1 may be formed in an upper portion of the semiconductor pattern SP.

Holes HO penetrating the stack structure SS may be defined. The holes HO may be located between the semiconductor patterns SP. Vertically extending gate electrodes GE may be provided in the hole HO penetrating the stack structure SS. In other words, the gate electrodes GE may penetrate the stack structure SS. The gate electrode GE may be adjacent to the channel region CH of the semiconductor pattern SP. The gate electrode GE may be provided on a side surface of the channel region CH and may extend in the third direction D3. The gate electrodes GE may include a conductive material, and the conductive material may include at least one of a doped semiconductor material, a conductive metal nitride, a metal, or a metal-semiconductor compound. The gate electrodes GE may be the word lines WL described with reference to FIG. 1.

A gate insulating layer GI may be disposed between the gate electrode GE and the channel region CH. The gate insulating layer GI may include at least one of a high-k dielectric layer, a silicon oxide layer, a silicon nitride layer, or a silicon oxynitride layer. For example, the high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The gate electrodes GE may include a first gate electrode GEa and a second gate electrode GEb which are provided at both sides of the channel region CH of the semiconductor pattern SP, respectively. In some example embodiments, the first and second gate electrodes GEa and GEb may constitute a single word line WL. In some example embodiments, the first gate electrode GEa may be the word line WL, and the second gate electrode GEb may be a back gate.

The gate insulating layer GI may be disposed between each of the gate electrodes GE and each of the semiconductor patterns SP. The gate insulating layer GI may include at least one of a high-k dielectric layer, a silicon oxide layer, a silicon nitride layer, or a silicon oxynitride layer.

A second insulating pattern IP2 may be provided to fill each of the holes HO. The second insulating pattern IP2 may cover the gate electrodes GE. For example, the second insulating pattern IP2 may be disposed between a pair of the gate electrodes GE adjacent to each other in the hole HO. The second insulating pattern IP2 may be disposed between a pair of the semiconductor patterns SP adjacent to each other. The second insulating pattern IP2 may include at least one of silicon oxide, silicon nitride, or silicon oxynitride. For example, the second insulating pattern IP2 may include silicon oxide having an etch selectivity with respect to the first insulating pattern IP1.

The data storage elements DS may be connected to other ends of the semiconductor patterns SP, respectively. In other words, the semiconductor patterns SP may connect the bit line BL to the data storage elements DS. The data storage elements DS may be connected to the second dopant regions SD2 of the semiconductor patterns SP, respectively.

In detail, the data storage elements DS may include the first conductive patterns EL1 extending in the second direction D2, the second conductive pattern EL2 adjacent to the first conductive patterns EL1, and a dielectric layer DL. The dielectric layer DL may be disposed between the first conductive patterns EL1 and the second conductive pattern EL2. The first conductive pattern EL1 and the second conductive pattern EL2 may be spaced apart from each other with the dielectric layer DL interposed therebetween and may constitute a capacitor. The data storage elements DS in the stack structure SS may share a single dielectric layer DL and a single second conductive pattern EL2. In other words, the first conductive pattern EL1 may be provided in plurality in the stack structure SS, and the single dielectric layer DL may cover surfaces of the first conductive patterns EL1. The single second conductive pattern EL2 may be provided on the single dielectric layer DL.

The first conductive pattern EL1 may have a width in the first direction D1, which increases as a distance from the semiconductor pattern SP increases. For example, referring to FIG. 5A, the first conductive pattern EL1 may include first to third portions EL1a, EL1b and EL1c. The first portion EL1a of the first conductive pattern EL1 may be electrically connected to the other end of the semiconductor pattern SP. The semiconductor pattern SP may have a first width w1 in the first direction D1. The first portion EL1a of the first conductive pattern EL1 may have a second width w2 equal to the first width w1. For example, a side surface of the semiconductor pattern SP may be coplanar with a side surface of the first portion EL1a of the first conductive pattern EL1.

The second portion EL1b of the first conductive pattern EL1 may have a third width w3 greater than the second width w2, and the third portion EL1c of the first conductive pattern EL1 may have a fourth width w4 greater than the third width w3. Each of the first to third portions EL1a, EL1b and EL1c of the first conductive pattern EL1 may extend in the second direction D2 and may have a substantially constant width in the first direction D1. The first to third portions EL1a, EL1b and EL1c of the first conductive pattern EL1 may be parallel to each other. The first conductive pattern EL1 may include stepped portions ST provided between the first and second portions EL1a and EL1b and between the second and third portions EL1b and EL1c, respectively. The width of the first conductive pattern EL1 in the first direction D1 may be nonlinearly changed at the stepped portion ST. Each of the first conductive patterns EL1 may have a cylindrical shape of which one end is opened.

Each of the first to third portions EL1a, EL1b and EL1c of the first conductive pattern EL1 may have two sidewalls facing each other in the first direction D1. Each of the two sidewalls may have a constant thickness in the first direction D1 and may extend in the second direction D2. The two sidewalls may be parallel to each other. The first portion EL1a of the first conductive pattern EL1 may include a connection portion connecting the two sidewalls. The connection portion may be adjacent to the semiconductor pattern SP.

Figure 4A:
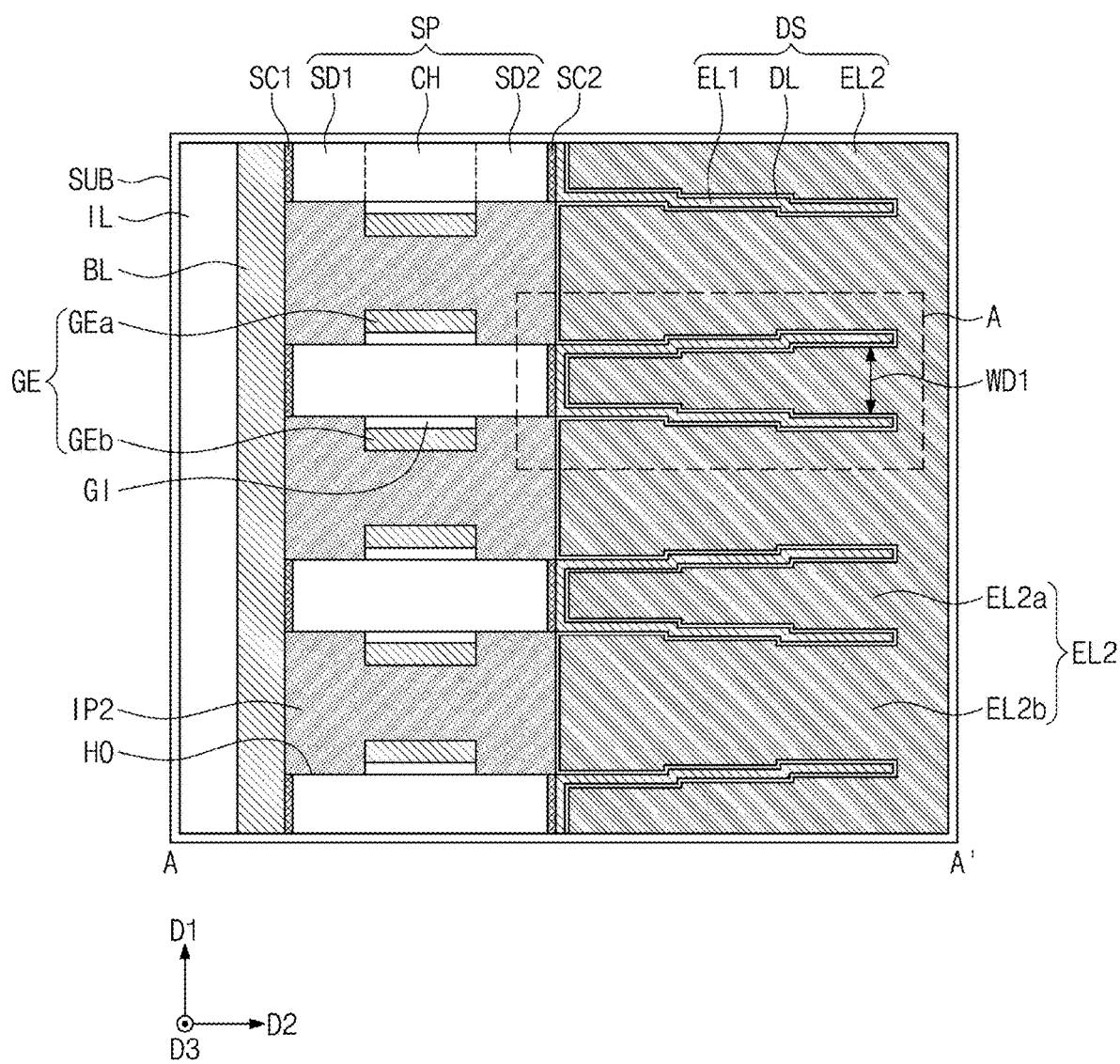
FIGS. 4A, 4B, 4C and 4D are cross-sectional views taken along lines A-A', B-B', C-C' and D-D' of FIG. 3, respectively.
Figure 4B:
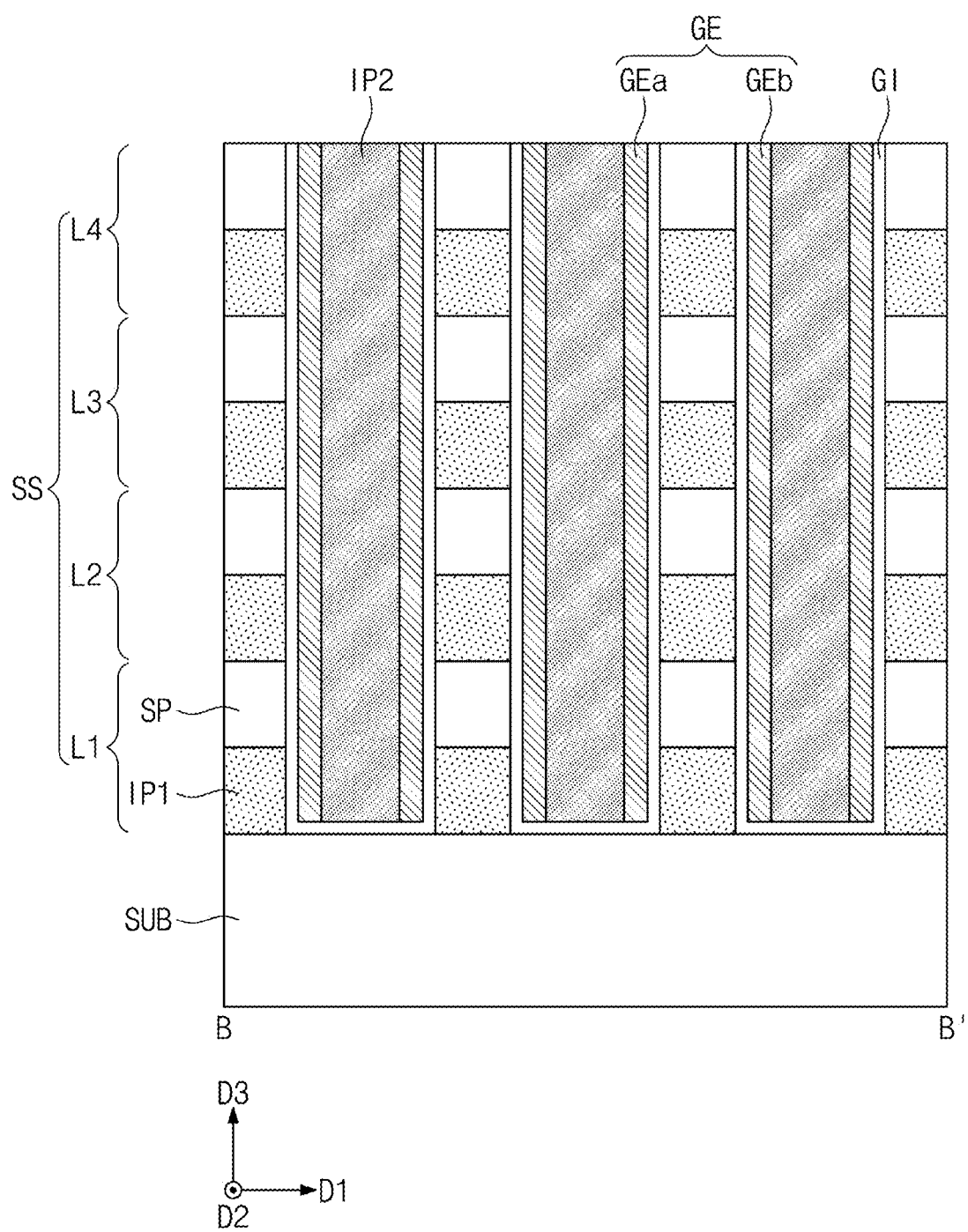
Figure 4C:
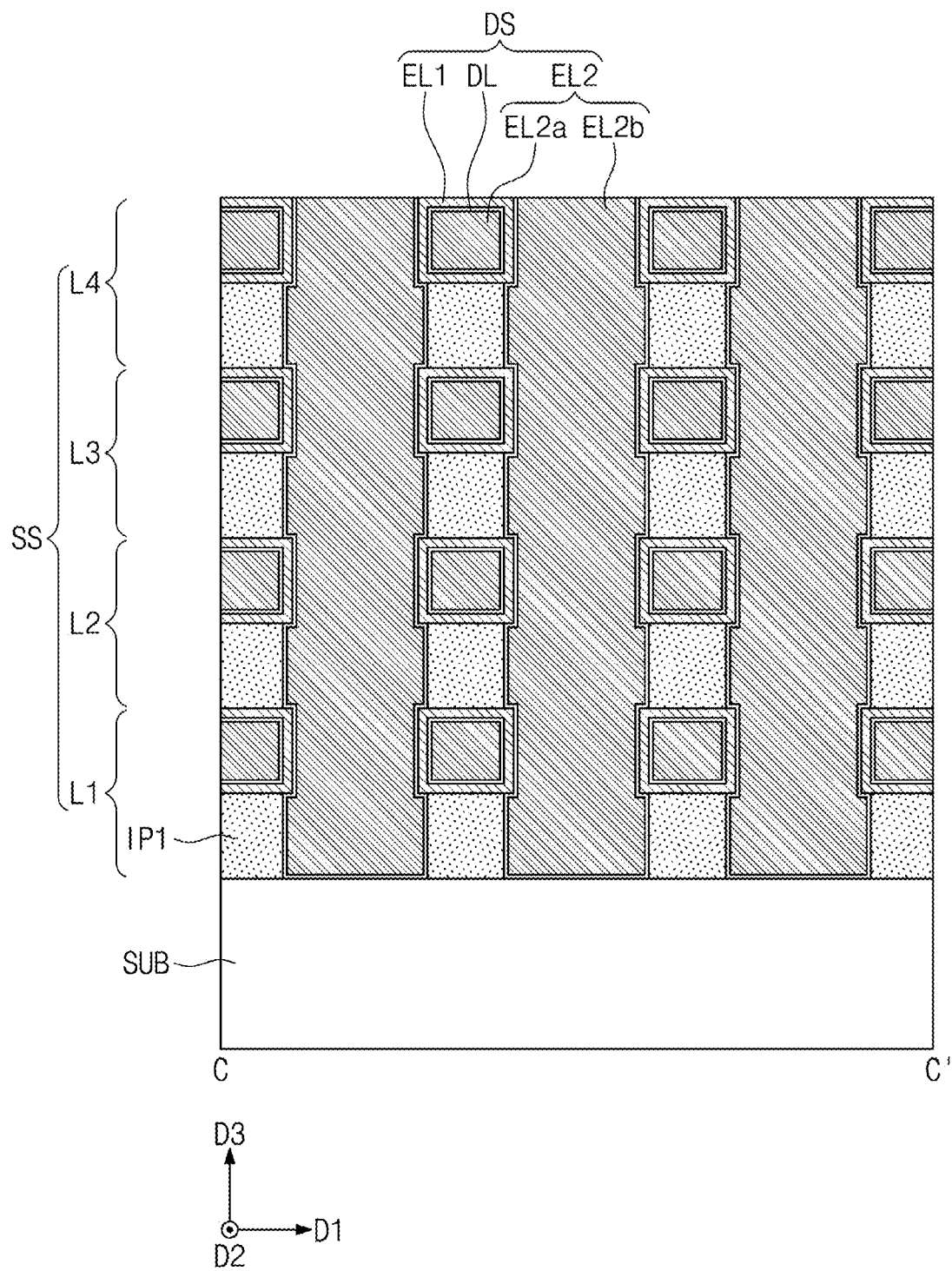
Figure 4D:
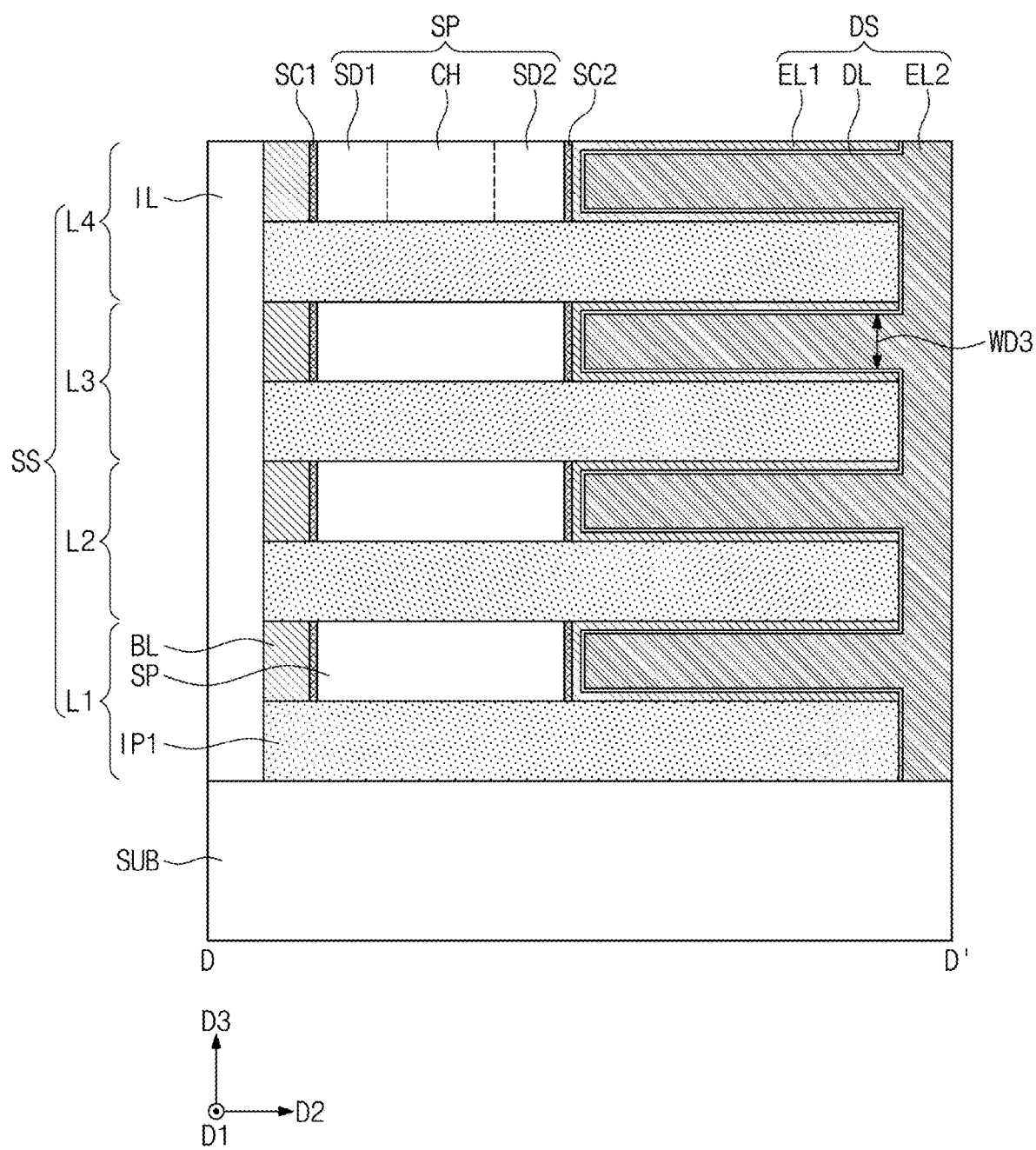

An insertion portion EL2a of the second conductive pattern EL2 which is inserted in the first conductive pattern EL1 may have a width WD1 in the first direction D1, which increases as a distance from the semiconductor pattern SP increases. A width WD3 of the insertion portion EL2a in the third direction D3 may be constant, as illustrated in FIG. 4D.

The second conductive pattern EL2 may be provided adjacent to the first conductive pattern ELL Each of the second patterns may have a surface facing a surface of the first pattern. The second conductive pattern EL2 may include the insertion portions EL2a inserted in the first conductive patterns EL1, respectively, and an outer portion EL2b surrounding at least a portion of the first conductive pattern ELL The width WD1 of the insertion portion EL2a in the first direction D1 may increase as a distance from the semiconductor pattern SP increases. The outer portion EL2b may connect the insertion portions EL2a.

Each of the first and second conductive patterns EL1 and EL2 may include at least one of a metal material (e.g., titanium, tantalum, tungsten, copper, or aluminum), a conductive metal nitride (e.g., titanium nitride or tantalum nitride), or a doped semiconductor material (e.g., doped silicon or doped germanium). The dielectric layer DL may include a high-k dielectric material, for example, hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof.

Figure 5A:
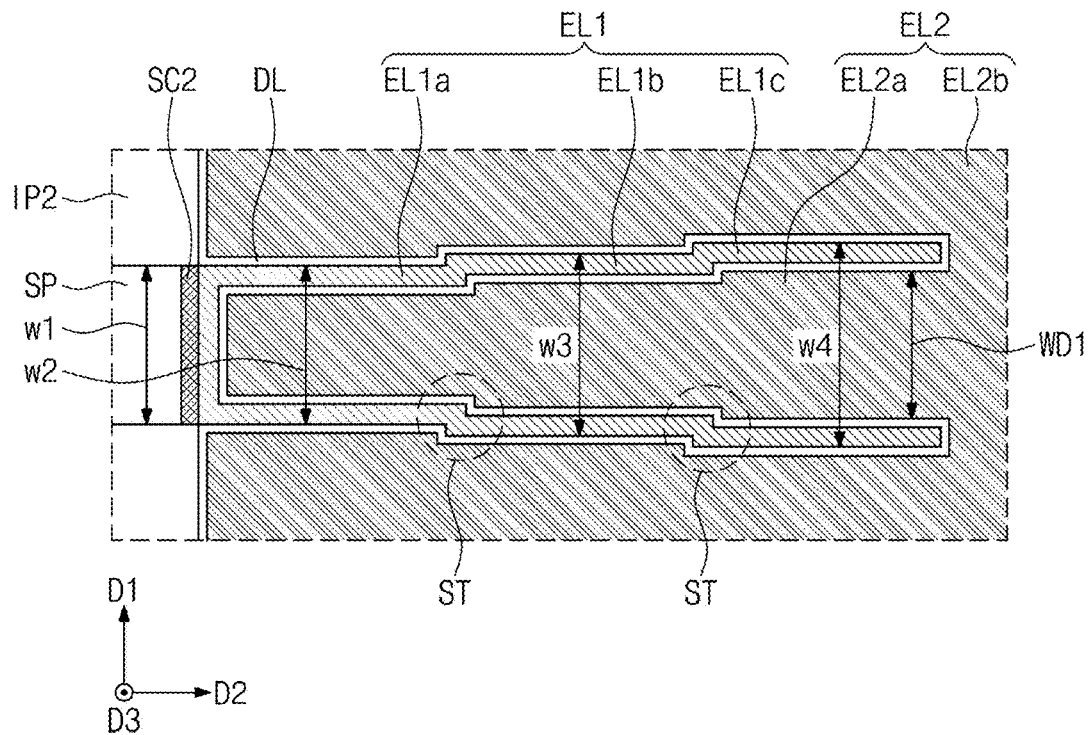
FIGS. 5A to 5D are enlarged views corresponding to a portion 'A' of FIG. 4A to illustrate semiconductor memory devices according to some example embodiments of the inventive concepts.
Figure 5B:
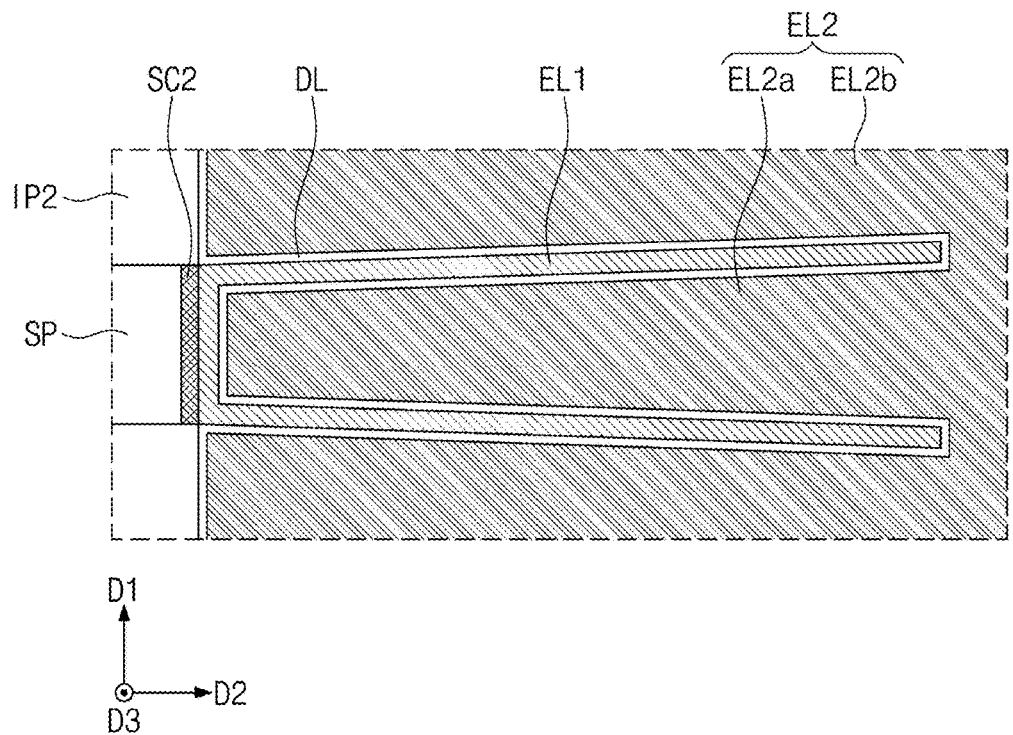

In some example embodiments, as illustrated in FIG. 5B, a width of the first conductive pattern EL1 in the first direction D1 may gradually increase as a distance from the semiconductor pattern SP increases.

Figure 5C:
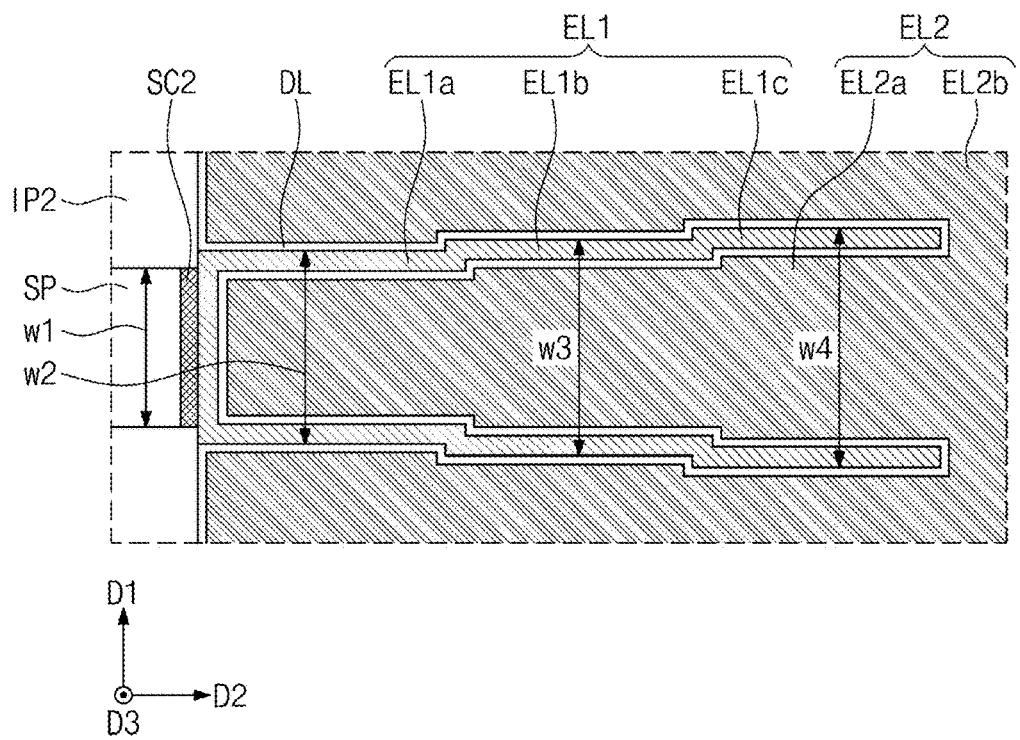
Figure 5D:
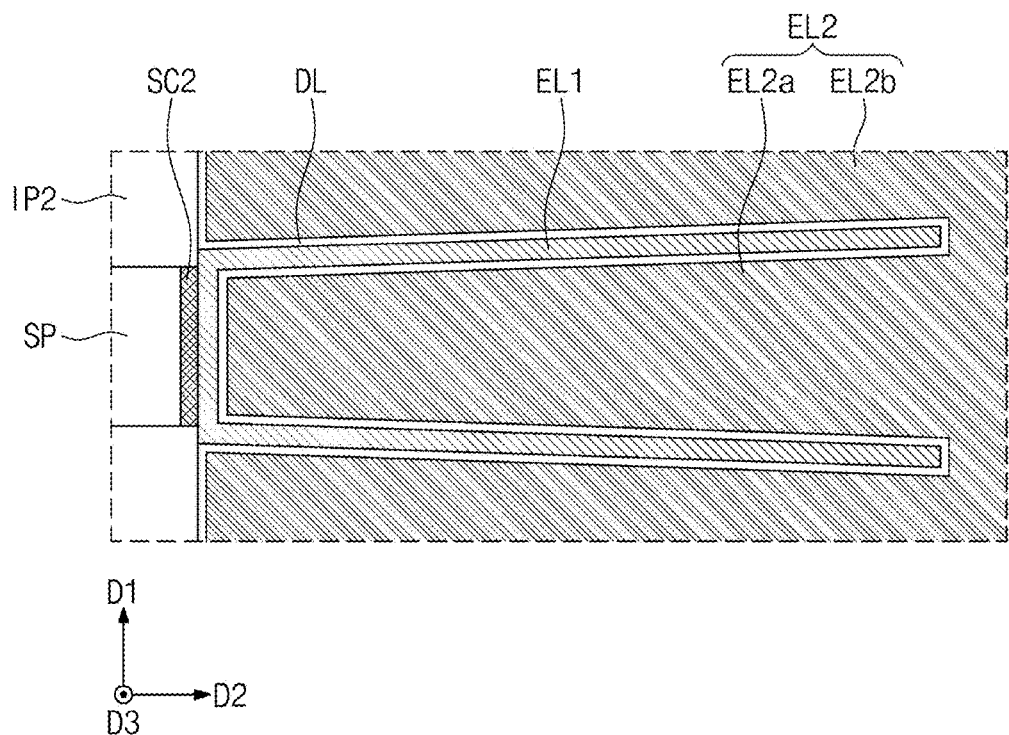
Figure 6:
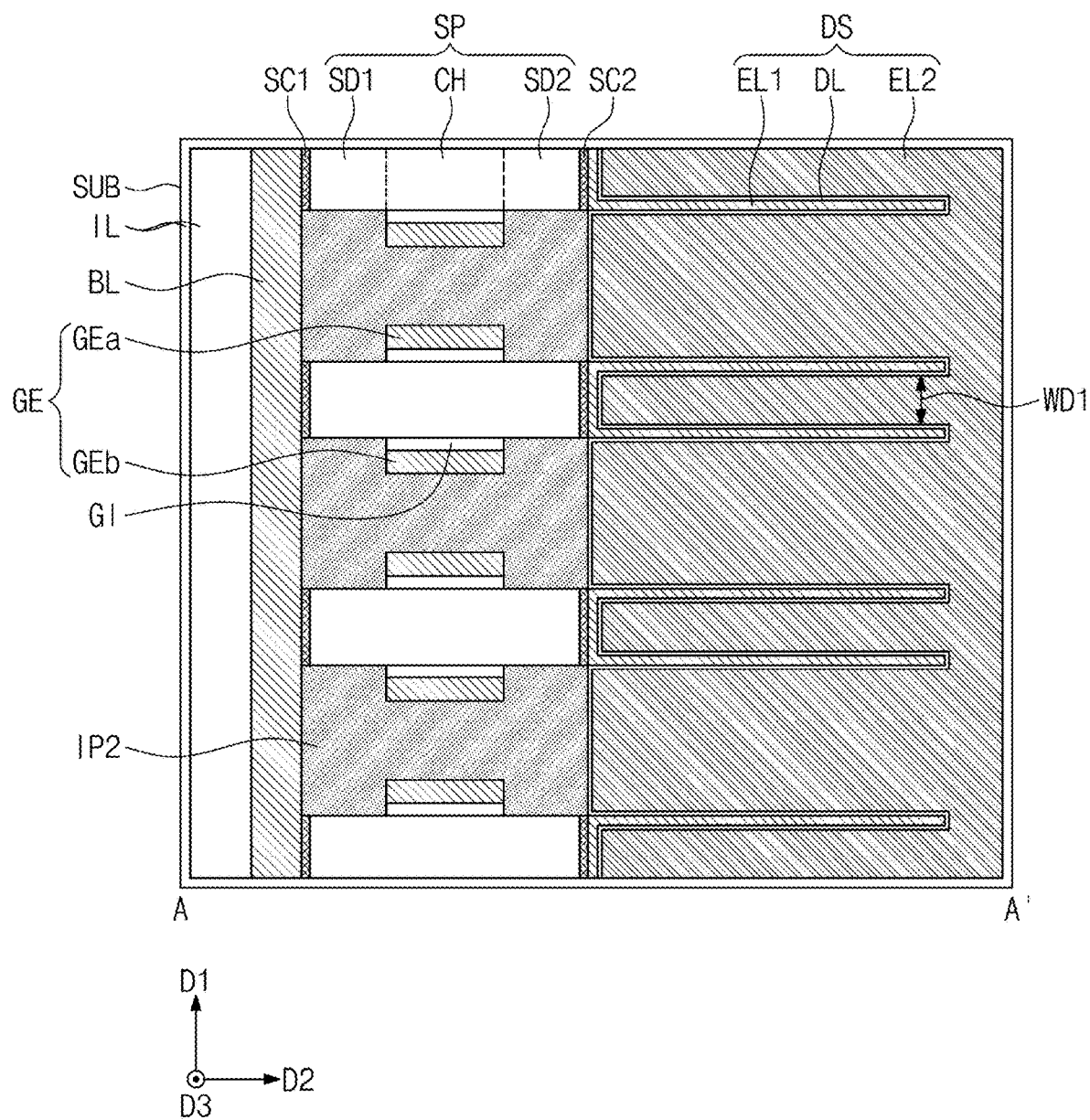
FIGS. 6 to 9 are cross-sectional views corresponding to the lines A-A', B-B', C-C' and D-D' of FIG. 3, respectively, to illustrate a semiconductor memory device according to some example embodiments of the inventive concepts.
Figure 7:
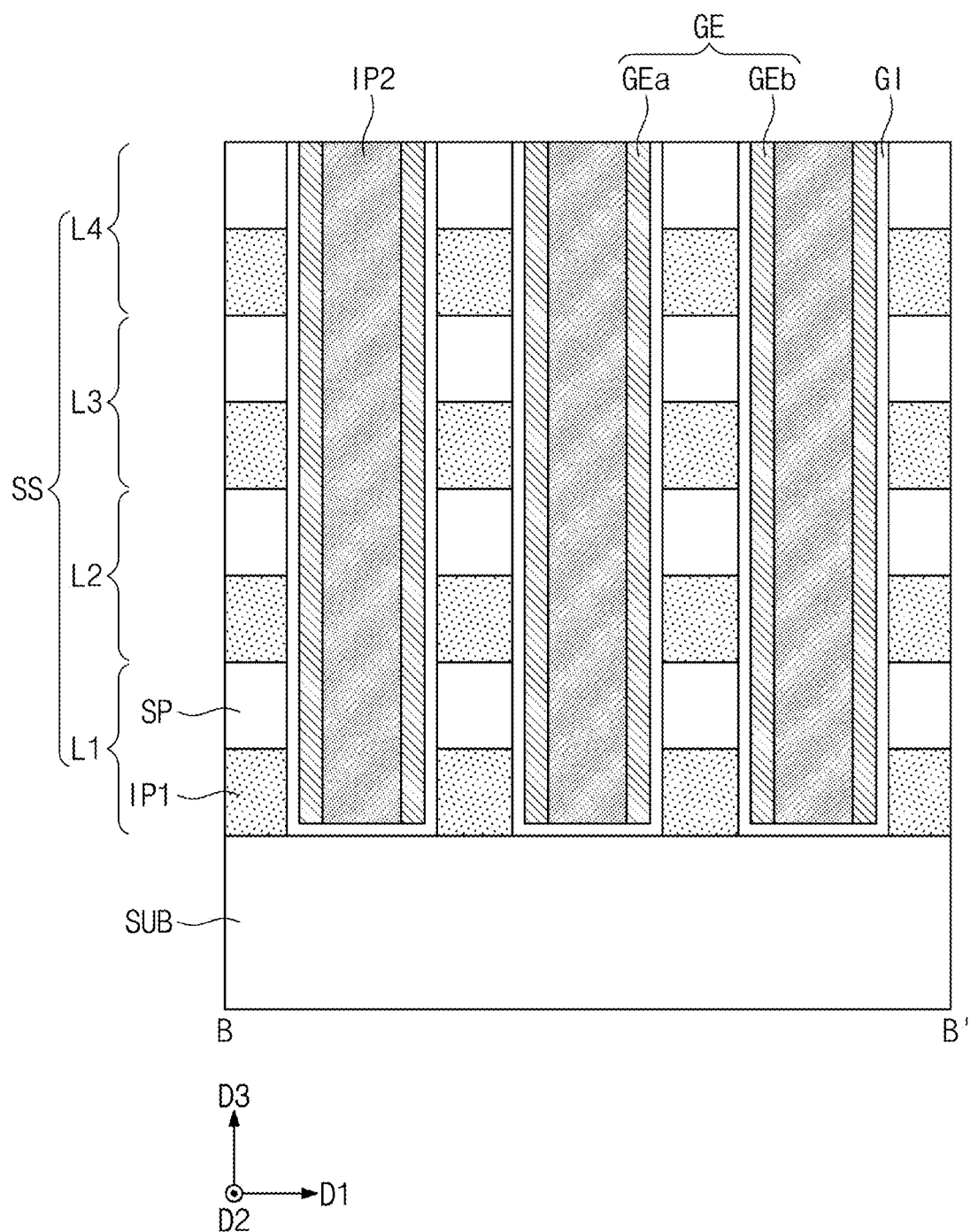
Figure 8:
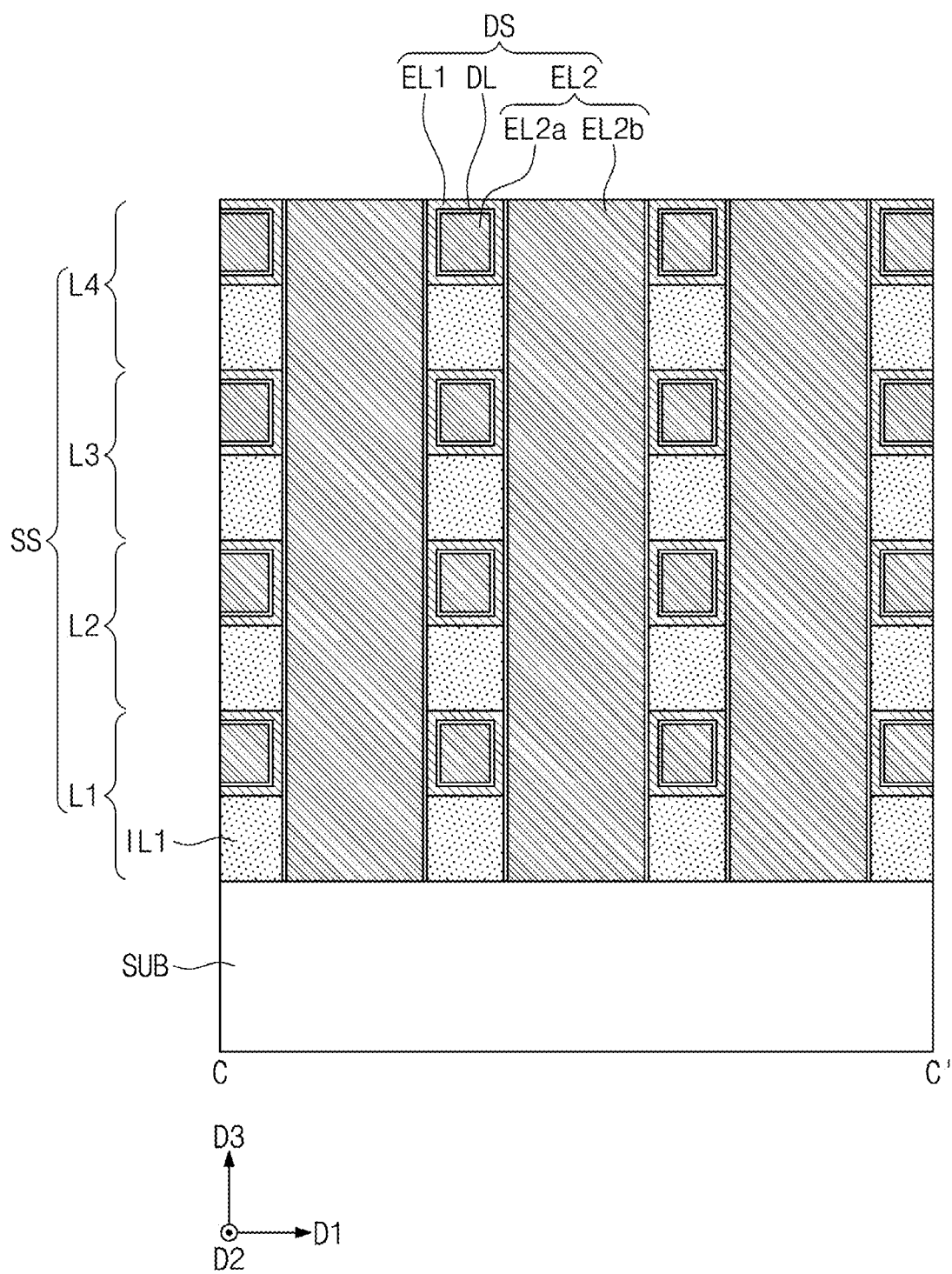
Figure 9:
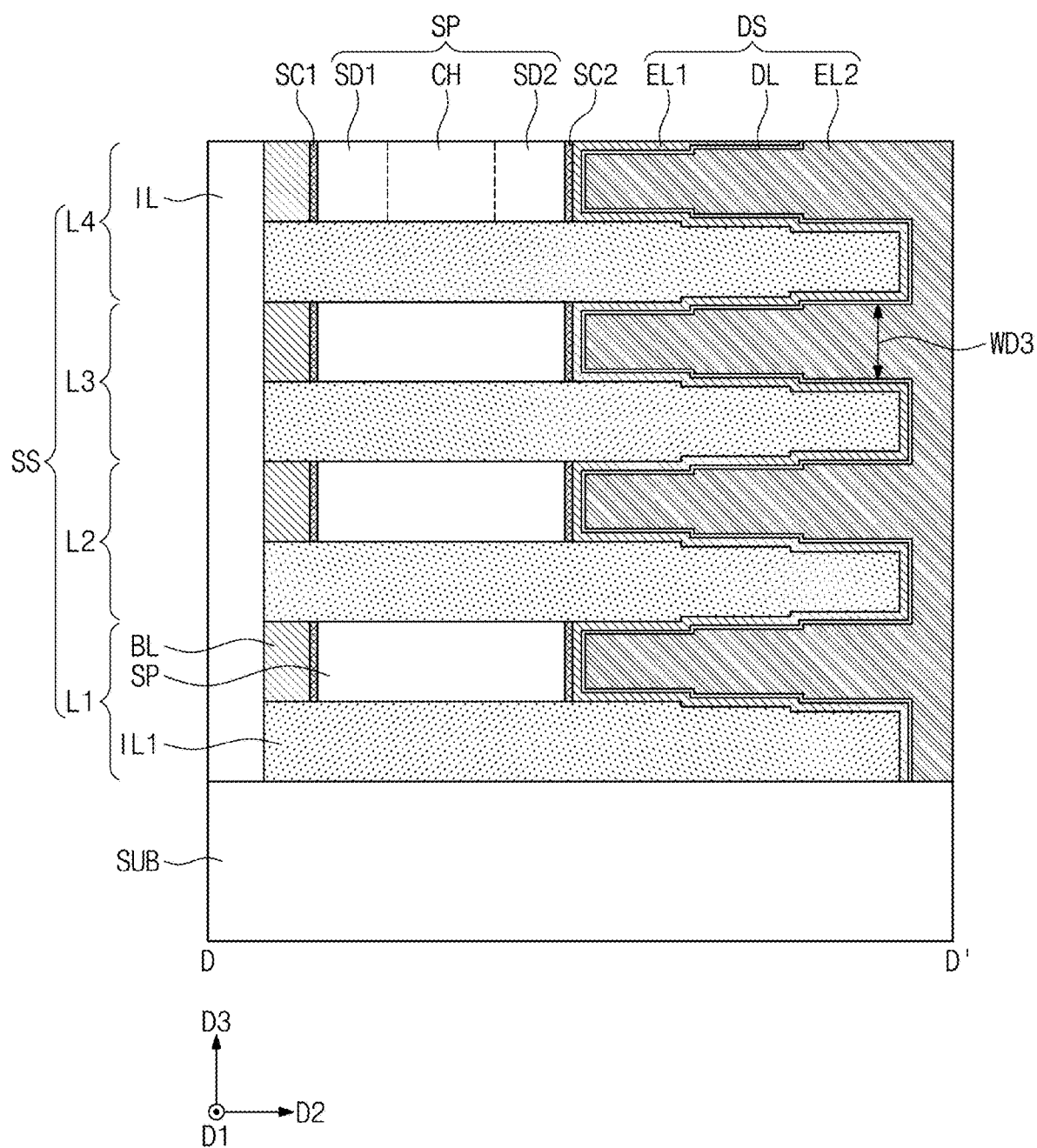

In some example embodiments, as illustrated in FIGS. 5C and 5D, a minimum width of the first conductive pattern EL1 in the first direction D1 may be greater than the width of the semiconductor pattern SP in the first direction D1. Thus, unlike the illustrations of FIGS. 5A and 5B, the side surfaces of the semiconductor pattern SP may not be aligned with side surfaces of the first conductive pattern ELL A first silicide pattern SC1 may be disposed between the bit line BL and the semiconductor pattern SP. A second silicide pattern SC2 may be disposed between the semiconductor pattern SP and the first conductive pattern ELL The bit line BL may be electrically connected to the first dopant region SD1 through the first silicide pattern SC1. The first conductive pattern EL1 may be electrically connected to the second dopant region SD2 through the second silicide pattern SC2. The first and second silicide patterns SC1 and SC2 may include a metal silicide (e.g., cobalt silicide).

FIGS. 6 to 9 are cross-sectional views corresponding to the lines A-A', B-B', C-C' and D-D' of FIG. 3, respectively, to illustrate a semiconductor memory device according to some example embodiments of the inventive concepts. Hereinafter, the detailed descriptions to the same components as in the example embodiments of FIGS. 4A to 4D will be omitted for the purpose of ease and convenience in explanation.

Referring to FIGS. 6 to 9, the first conductive pattern EL1 and the insertion portion EL2a of the second conductive pattern EL2 may have constant widths in the first direction D1. The width of the first conductive pattern EL1 in the first direction D1 may be substantially equal to the width of the semiconductor pattern SP in the first direction D1. Side surfaces of the first conductive pattern EL1 may be aligned with side surfaces of the semiconductor pattern SP and side surfaces of the first insulating pattern IP1. A width of the first conductive pattern EL1 in the third direction D3 may increase as a distance from the semiconductor pattern SP increases. In addition, the insertion portion EL2a of the second conductive pattern EL2 may have a width WD3 in the third direction D3, which increases as a distance from the semiconductor pattern SP increases. The insertion portion EL2a of the second conductive pattern EL2 may have a constant width WD1 in the first direction D1. A width of the first insulating pattern IP1 in the third direction D3 may decrease as a distance from the semiconductor pattern SP increases.

Figure 13A:
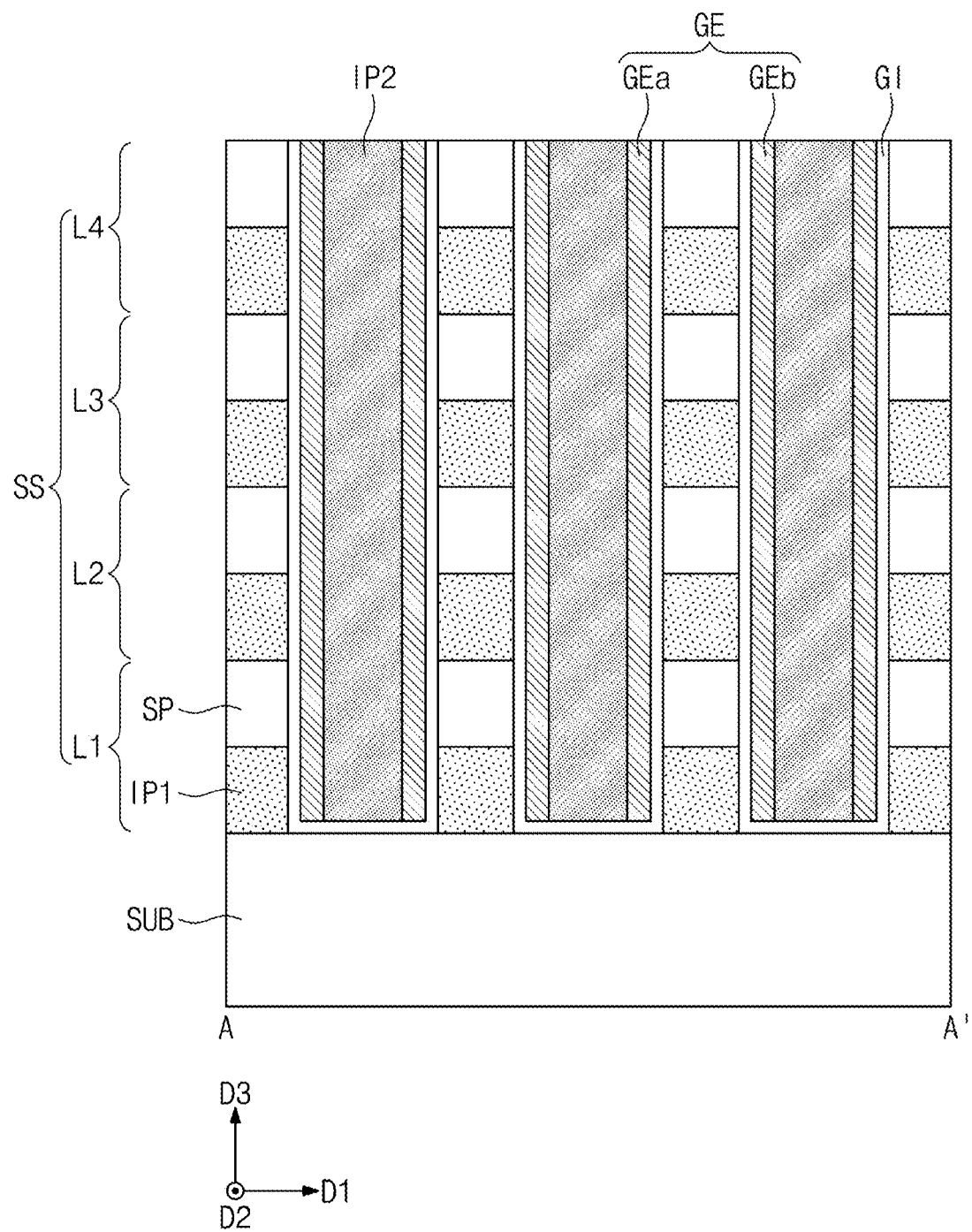
Figure 13B:
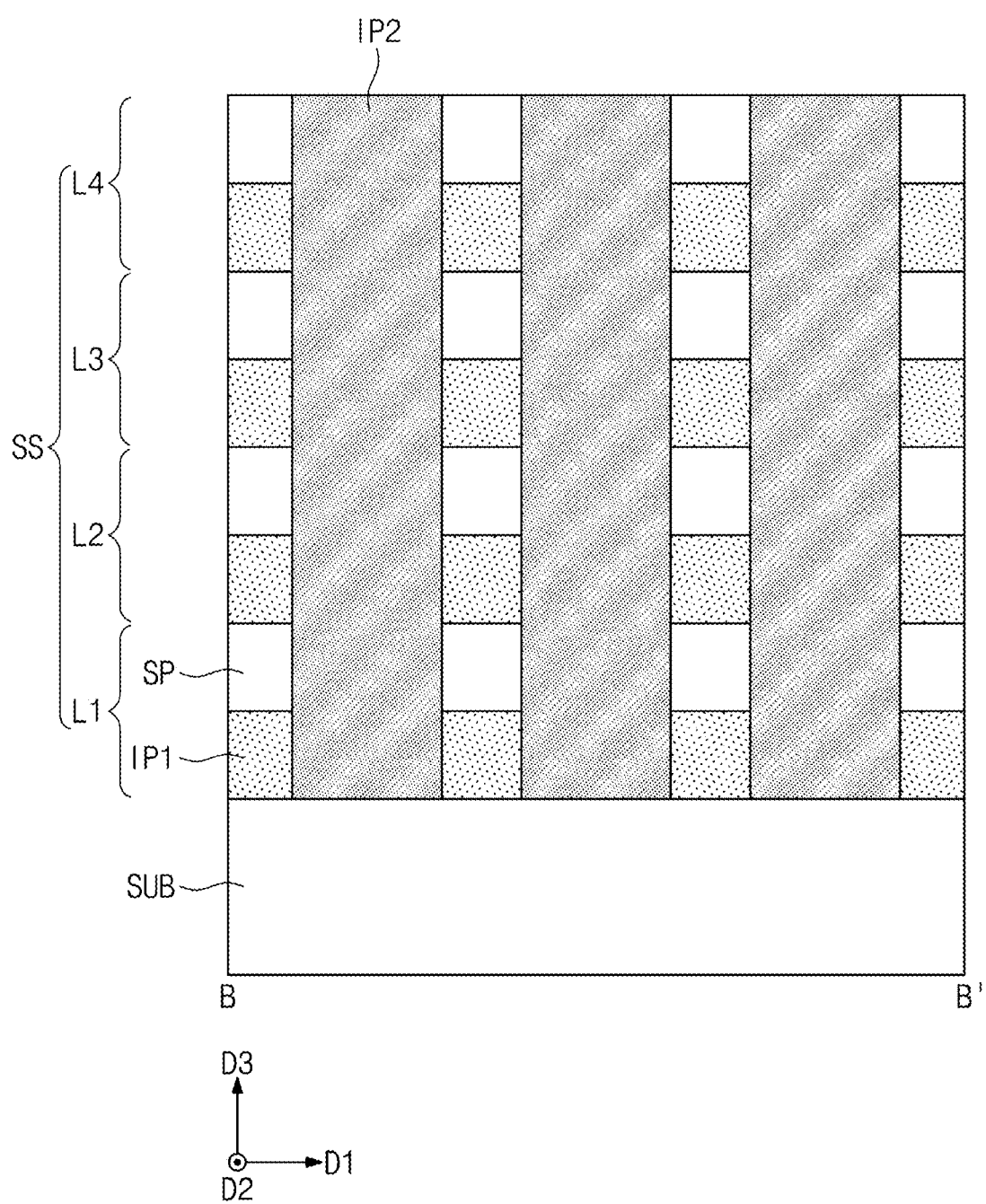
FIGS. 13B, 19B and 22B are cross-sectional views taken along lines B-B' of FIGS. 12, 18 and 21, respectively.
Figure 13C:
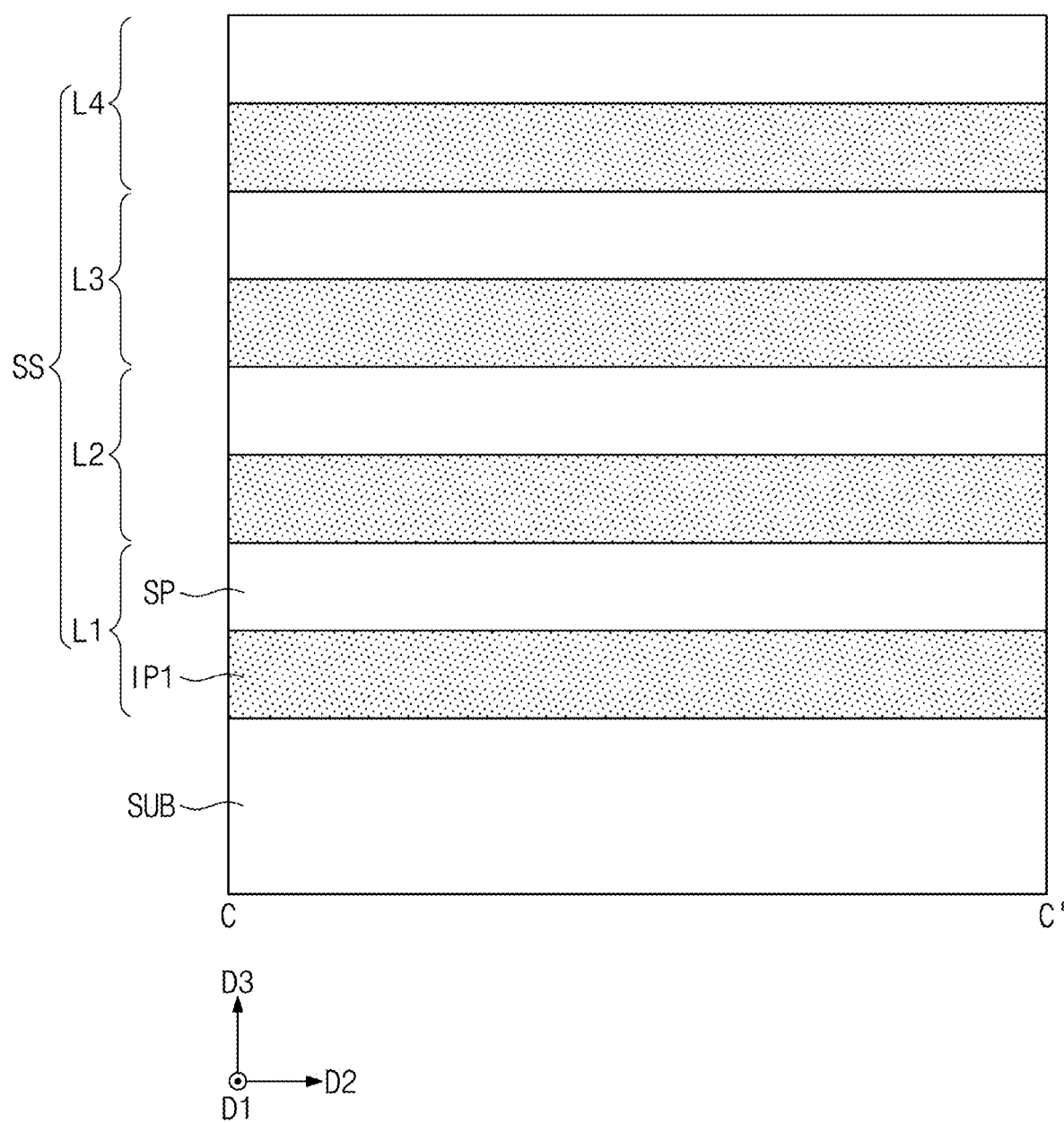
FIG. 13C is a cross-sectional view taken along a line C-C' of FIG. 12.

FIGS. 10, 12, 14, 16, 18 and 21 are plan views illustrating a method for manufacturing a semiconductor memory device, according to some example embodiments of the inventive concepts. FIGS. 11, 13A, 15, 17, 19A and 22A are cross-sectional views taken along lines A-A' of FIGS. 10, 12, 14, 16, 18 and 21, respectively. FIGS. 13B, 19B and 22B are cross-sectional views taken along lines B-B' of FIGS. 12, 18 and 21, respectively. FIG. 13C is a cross-sectional view taken along a line C-C' of FIG. 12.

Figure 10:
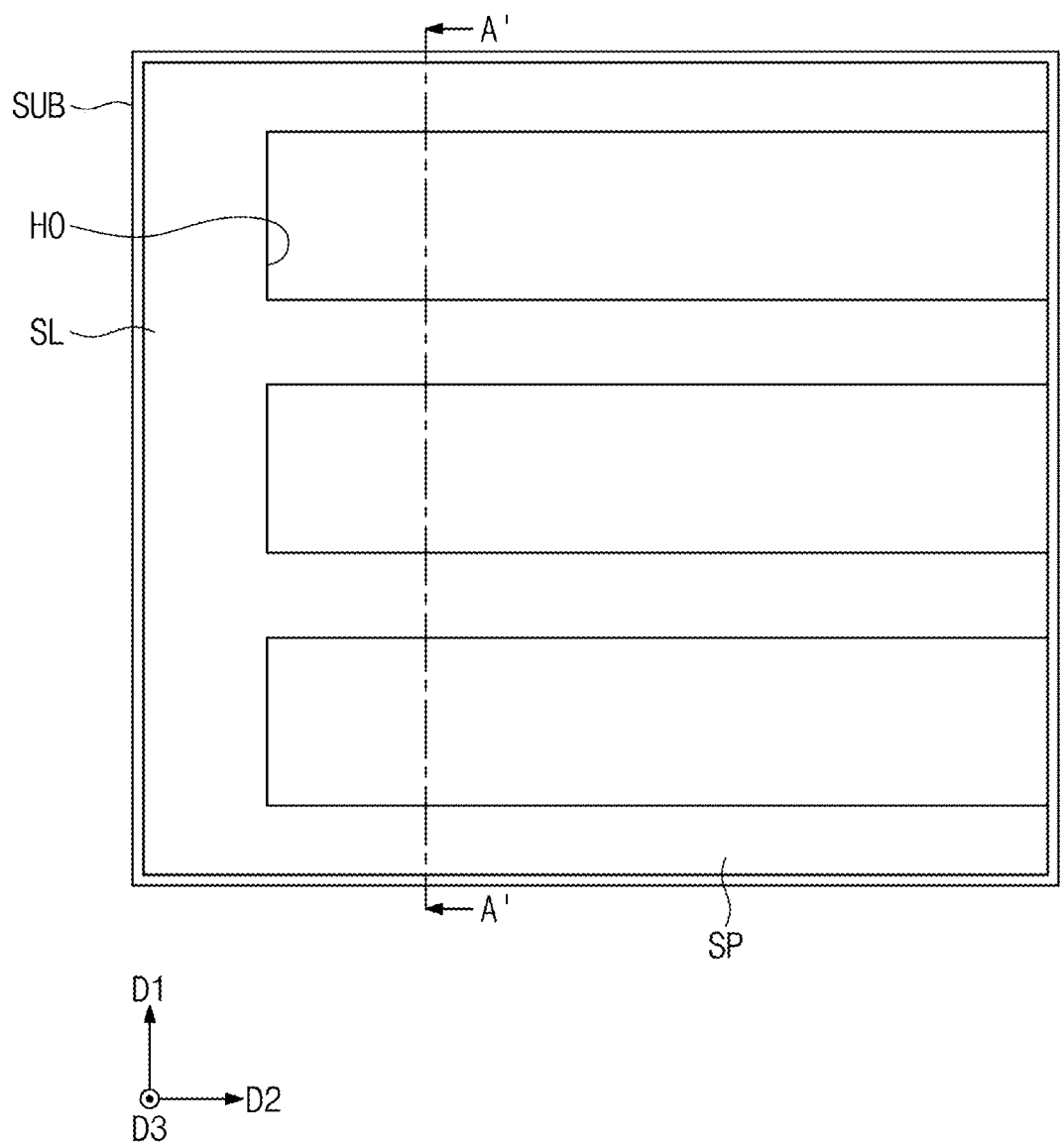
FIGS. 10, 12, 14, 16, 18 and 21 are plan views illustrating a method for manufacturing a semiconductor memory device, according to some example embodiments of the inventive concepts.
Figure 11:
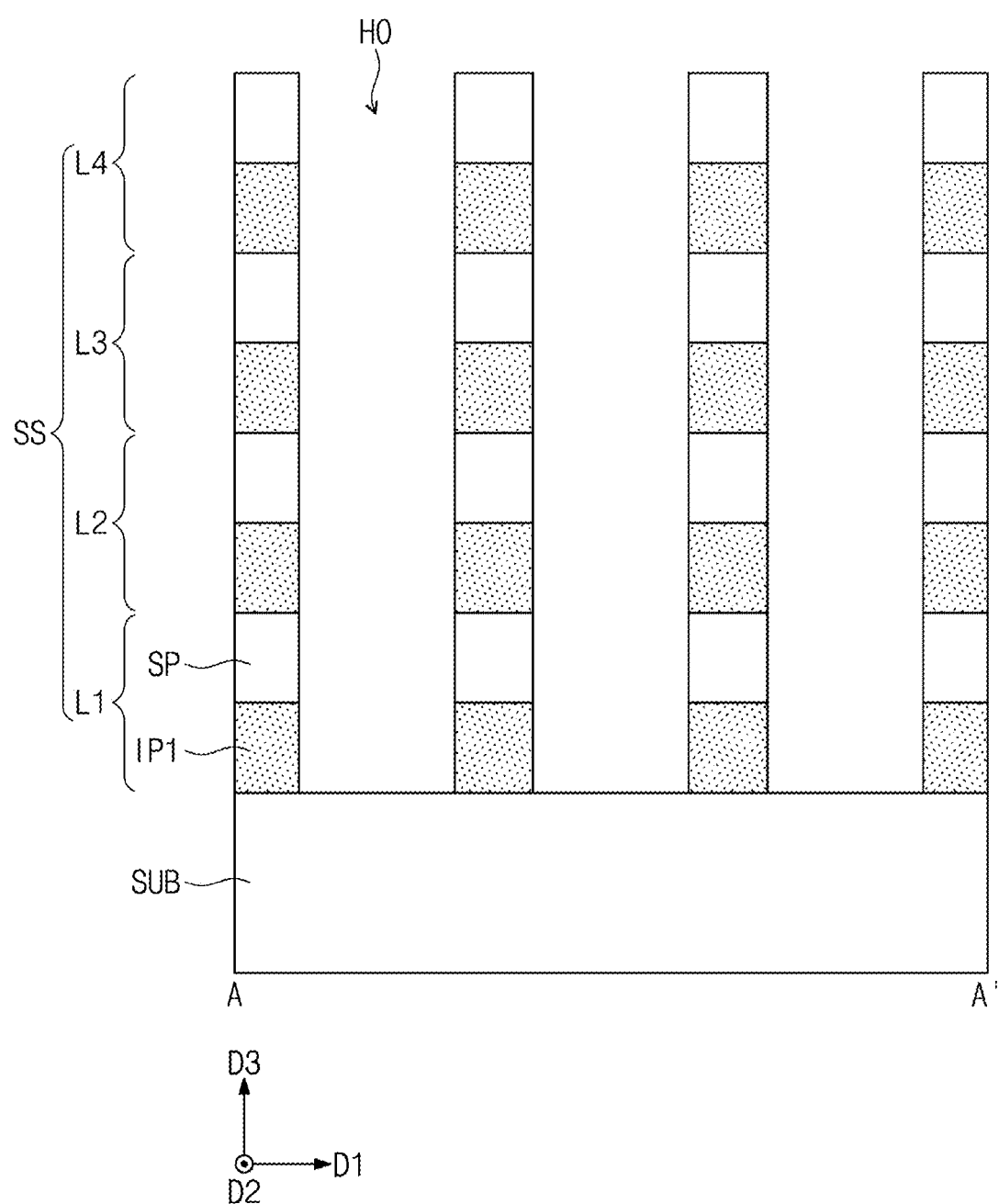
FIGS. 11, 13A, 15, 17, 19A and 22A are cross-sectional views taken along lines A-A' of FIGS. 10, 12, 14, 16, 18 and 21, respectively.
Figure 12:
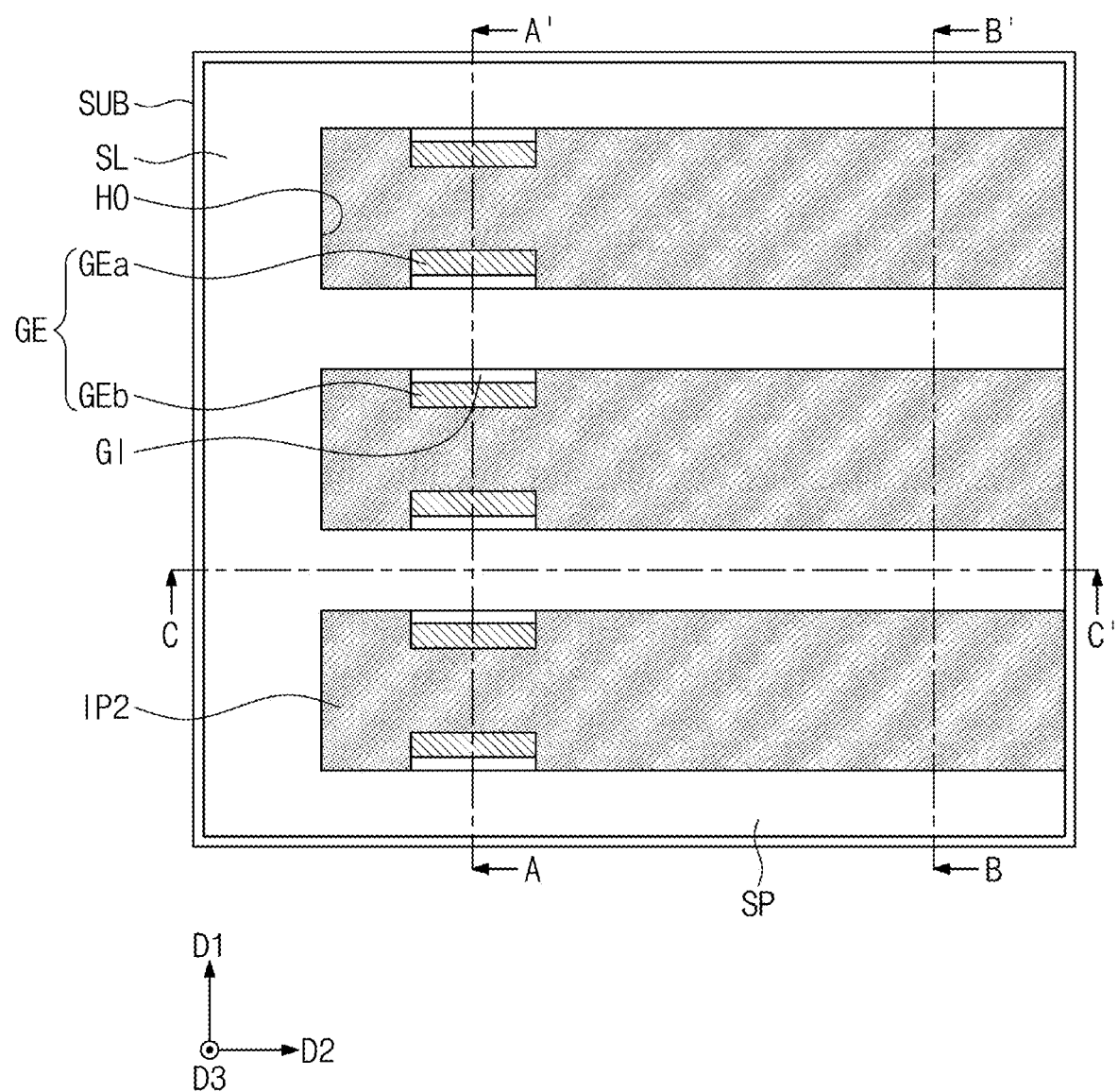

Referring to FIGS. 10 and 11, a stack structure SS may be formed on a substrate SUB. The formation of the stack structure SS may include forming first to fourth layers L1, L2, L3 and L4 sequentially stacked.

Each of the first to fourth layers L1, L2, L3 and L4 may include a first insulating pattern IP1 and a semiconductor layer SL. In other words, the first insulating patterns IP1 and the semiconductor layers SL may be alternately formed. The semiconductor layer SL may include a semiconductor material such as silicon, germanium, or silicon-germanium. The first insulating pattern IP1 may include at least one of silicon oxide, silicon nitride, silicon oxynitride, carbon-containing silicon oxide, carbon-containing silicon nitride, or carbon-containing silicon oxynitride. For example, the first insulating pattern IP1 may be formed of silicon nitride (SiN).

The stack structure SS may be patterned to form holes HO penetrating the stack structure SS. Each of the holes HO may have a line or bar shape extending in the second direction D2. The holes HO may be arranged in the first direction D1 and may be spaced apart from each other. Semiconductor patterns SP may be defined in each of the semiconductor layers SL by the holes HO. For example, the semiconductor pattern SP may be defined between a pair of the holes HO adjacent to each other. The semiconductor patterns SP may have bar shapes extending in the second direction D2.

Referring to FIGS. 12 and 13A to 13C, gate insulating layers GI and gate electrodes GE may be formed in each of the holes HO. For example, a gate insulating layer and a gate electrode layer may be formed in the holes HO and then may be patterned to form the gate insulating layers GI and the gate electrodes GE. The gate electrode GE and the gate insulating layer GI may extend in the third direction D3 along an inner side surface of the stack structure SS exposed by the hole HO. The gate electrodes GE may include a first gate electrode GEa and a second gate electrode GEb which are provided at both sides of the semiconductor pattern SP, respectively.

After the formation of the gate electrodes GE, a second insulating pattern IP2 may be formed to fill each of the holes HO. The second insulating pattern IP2 may include at least one of silicon oxide, silicon nitride, or silicon oxynitride. The second insulating pattern IP2 may have an etch selectivity with respect to the first insulating pattern IP1. For example, when the first insulating pattern IP1 includes silicon nitride (SiN), the second insulating pattern IP2 may include silicon oxide (SiO).

Figure 14:
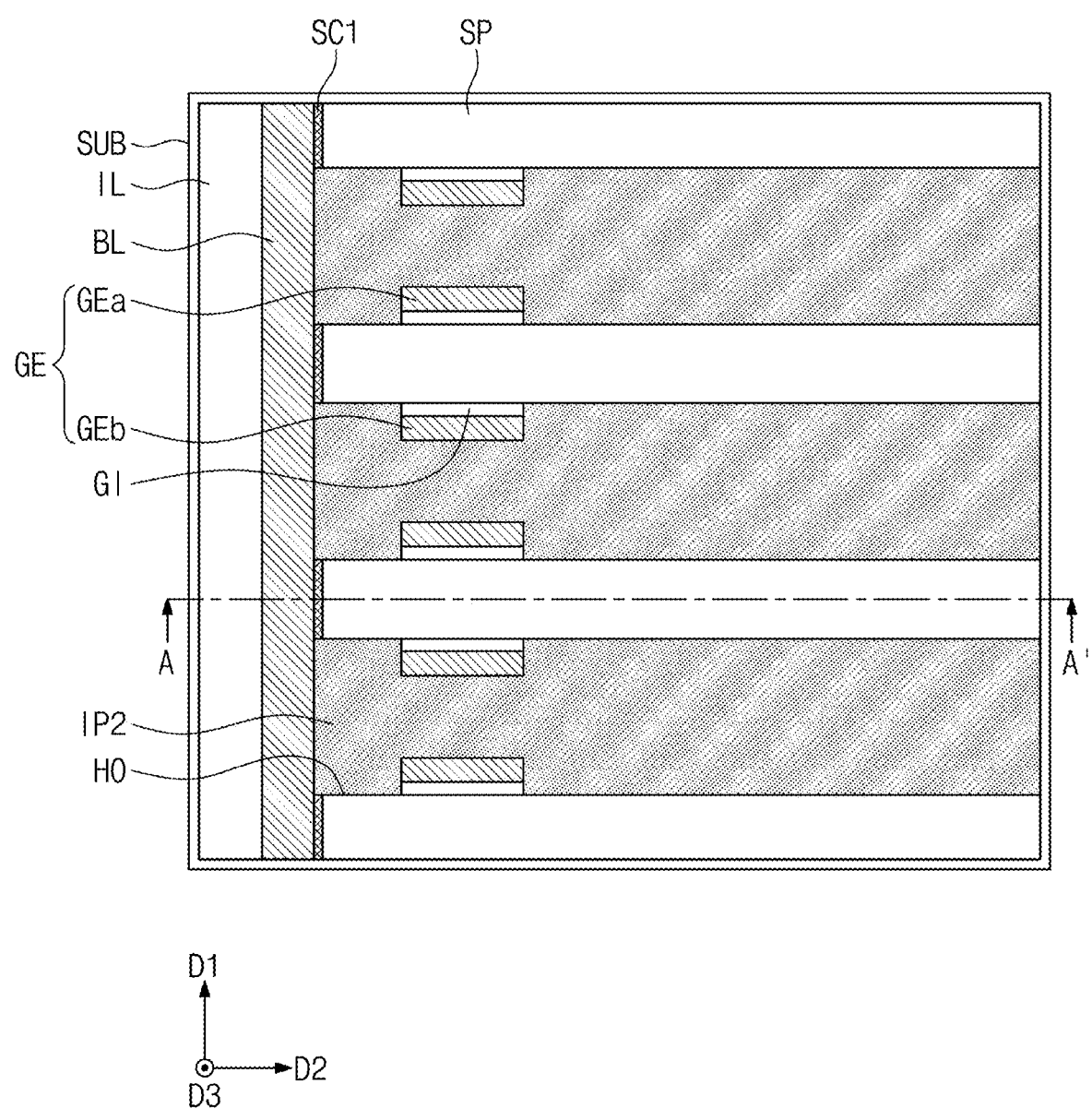
Figure 15:
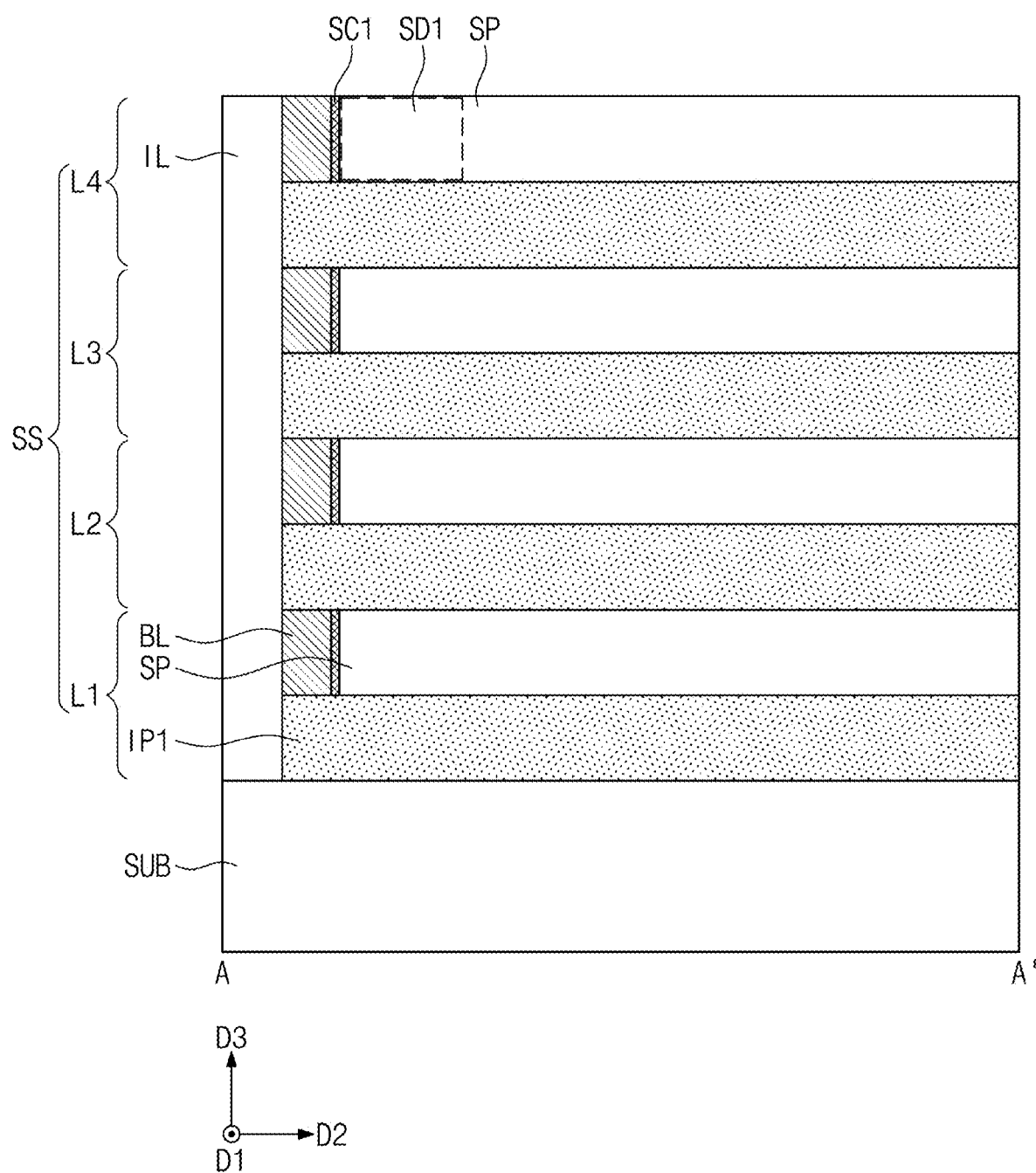

Referring to FIGS. 14 and 15, a portion of the semiconductor layer SL except the semiconductor patterns SP may be replaced with a bit line BL. A wet etching process of selectively etching the semiconductor layer SL may be performed on one side surface of the stack structure SS. A portion of the semiconductor layer SL may be removed by the wet etching process. The bit line BL may be formed by forming a conductive material in a space formed by the removal of the semiconductor layer SL. The bit line BL may partially fill the space formed by the removal of the semiconductor layer SL, and a remaining region of the space formed by the removal of the semiconductor layer SL may be filled with an insulating layer IL. The bit line BL may extend in the first direction D1. The bit line BL may be electrically connected to the semiconductor patterns SP.

A first silicide pattern SC1 may be formed between the bit line BL and each of the semiconductor patterns SP. The formation of the first silicide pattern SC1 may include performing a silicidation process on the semiconductor patterns SP exposed by the removal of the portion of the semiconductor layer SL, before the formation of the bit line BL.

First dopant regions SD1 may be formed in the semiconductor patterns SP, respectively. The formation of the first dopant region SD1 may include injecting dopants into the semiconductor pattern SP through one end of the semiconductor pattern SP exposed by the removal of the portion of the semiconductor layer SL, before the formation of the bit line BL.

Figure 16:
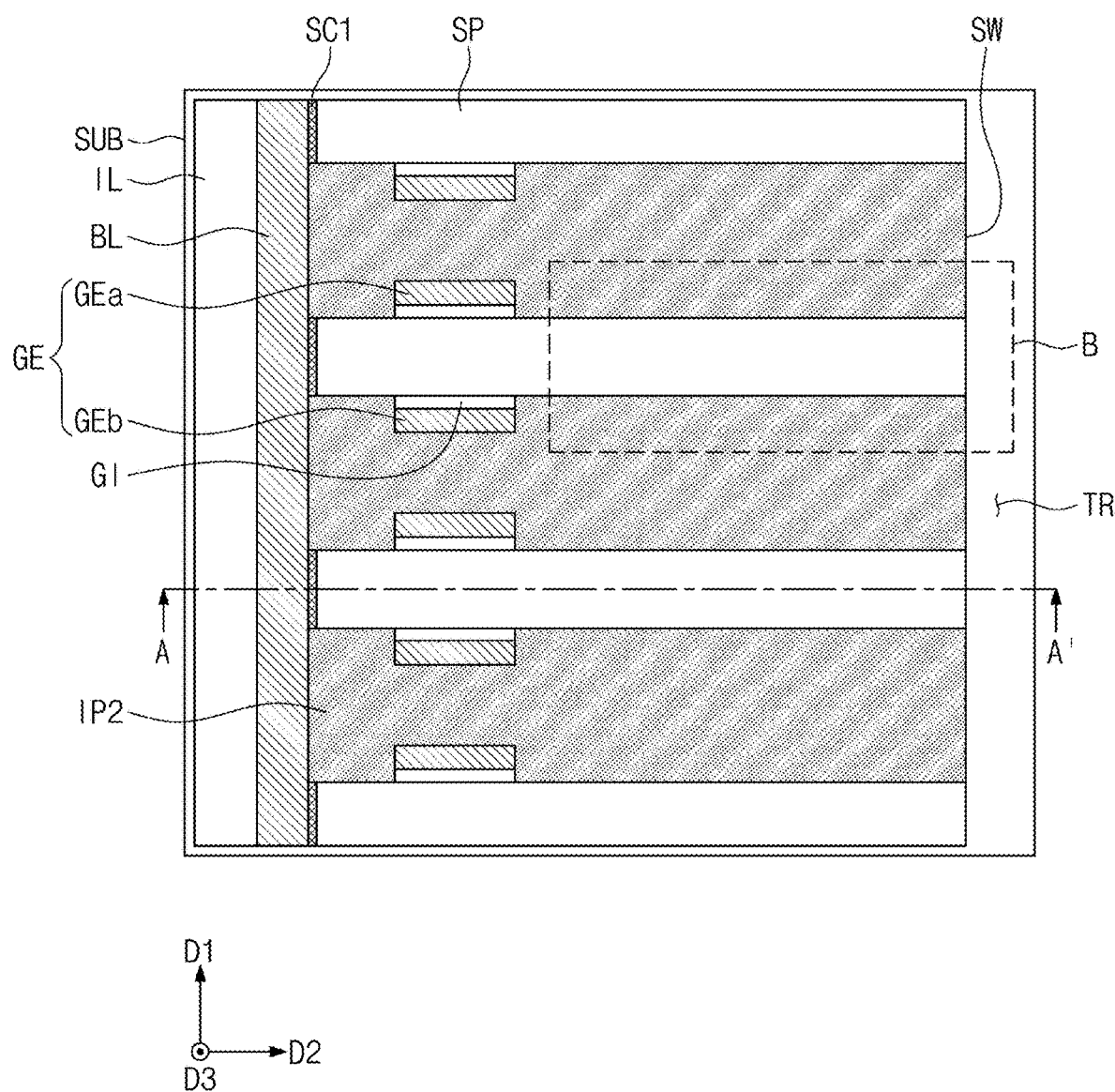
Figure 17:
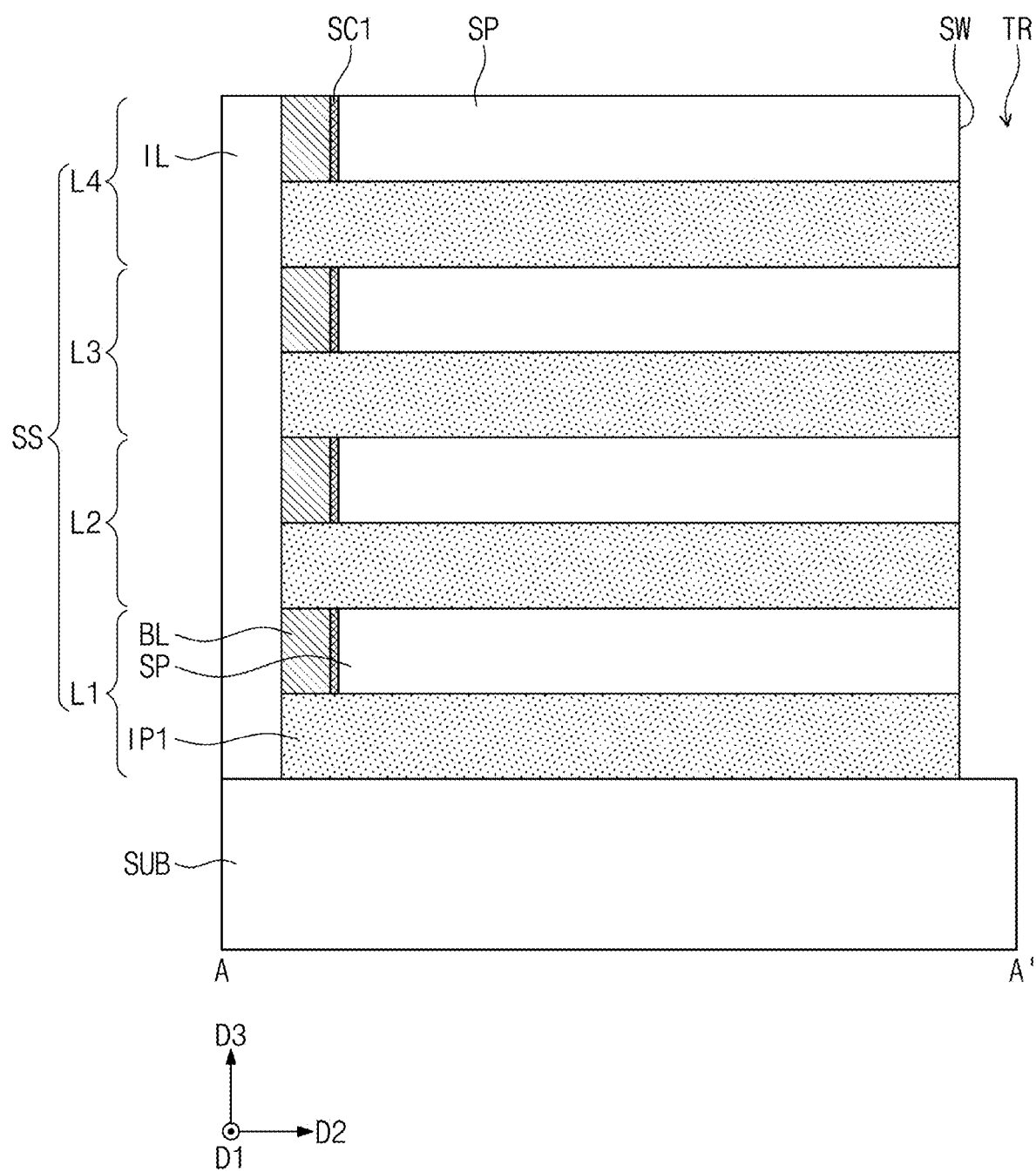

Referring to FIGS. 16 and 17, a portion of the stack structure SS may be removed to form a first surface SW exposing end surfaces (e.g., side surfaces) of the semiconductor patterns SP. The first surface SW may include side surfaces of the semiconductor patterns SP, side surfaces of the first insulating patterns IP1, and side surfaces of the second insulating patterns IP2. The side surfaces of the semiconductor patterns SP, the side surfaces of the first insulating patterns IP1 and the side surfaces of the second insulating patterns IP2 may be coplanar with each other.

In detail, a trench TR extending in the first direction D1 may be formed in the stack structure SS. The formation of the trench TR may include forming a mask pattern (not shown) defining the trench TR on the stack structure SS, and etching the stack structure SS using the mask pattern as an etch mask. Since the trench TR is formed, lengths, in the second direction D2, of the semiconductor patterns SP, the first insulating patterns IP1 and the second insulating patterns IP2 may be shortened.

Figure 18:
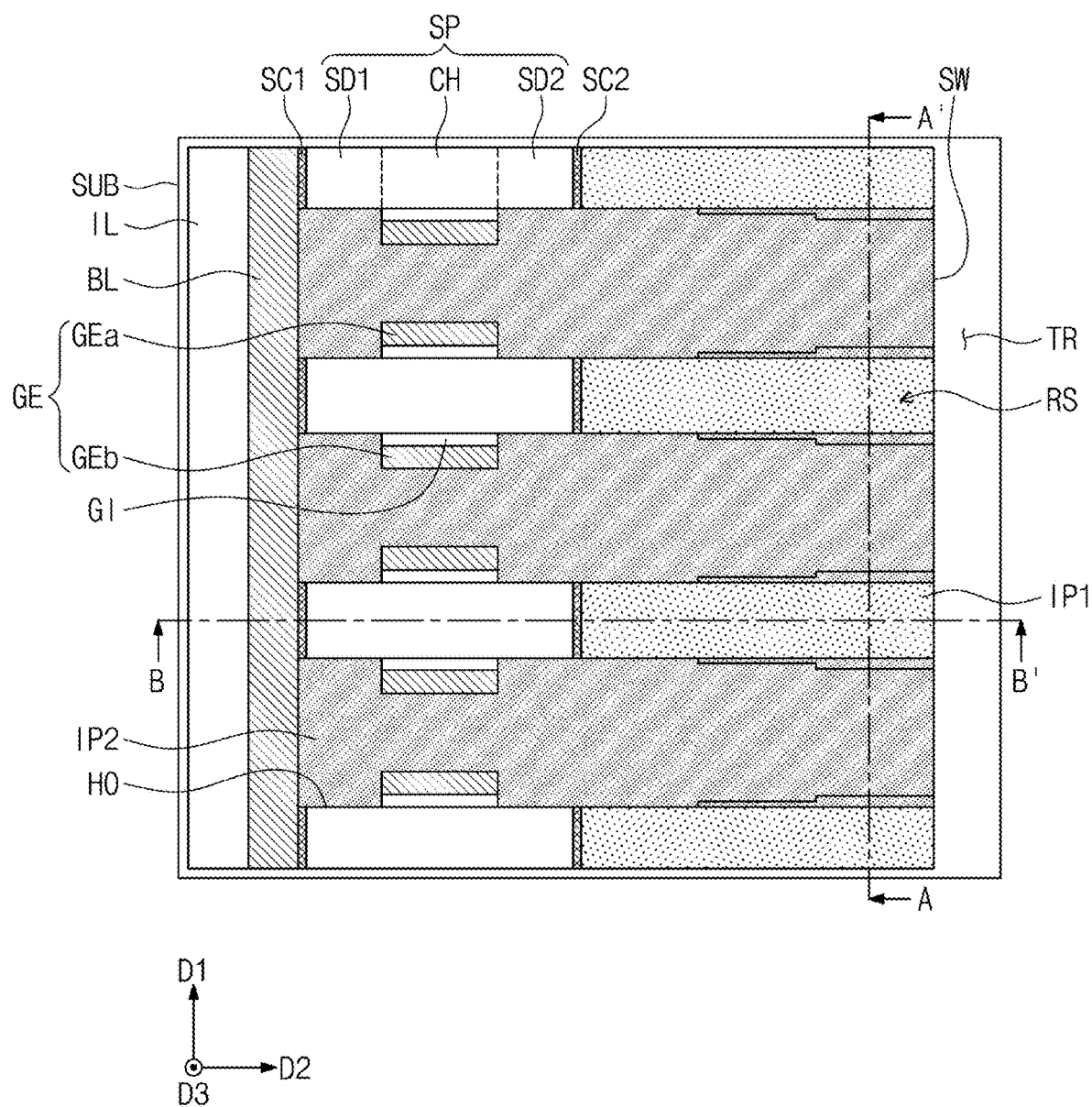
Figure 19A:
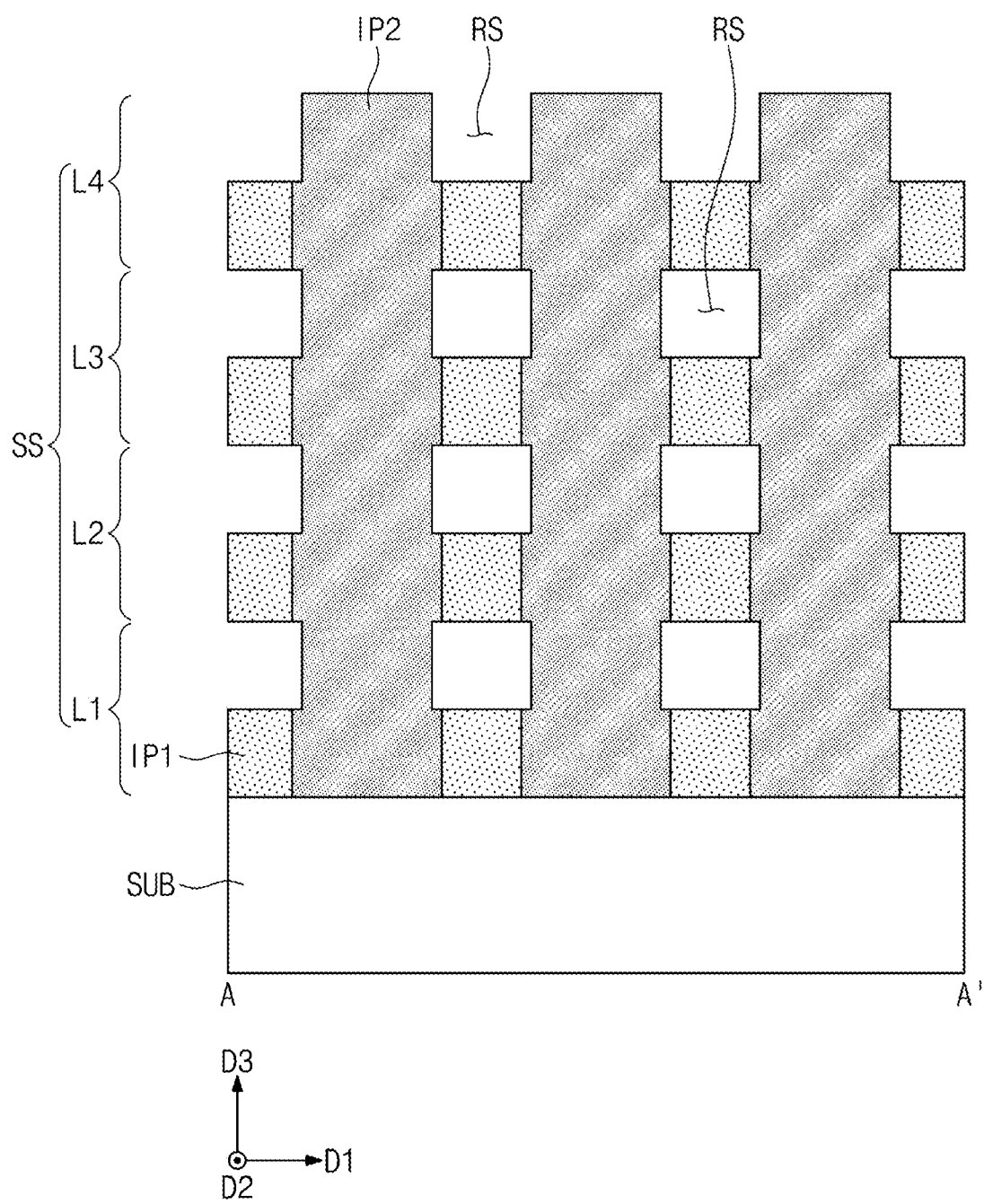
Figure 19B:
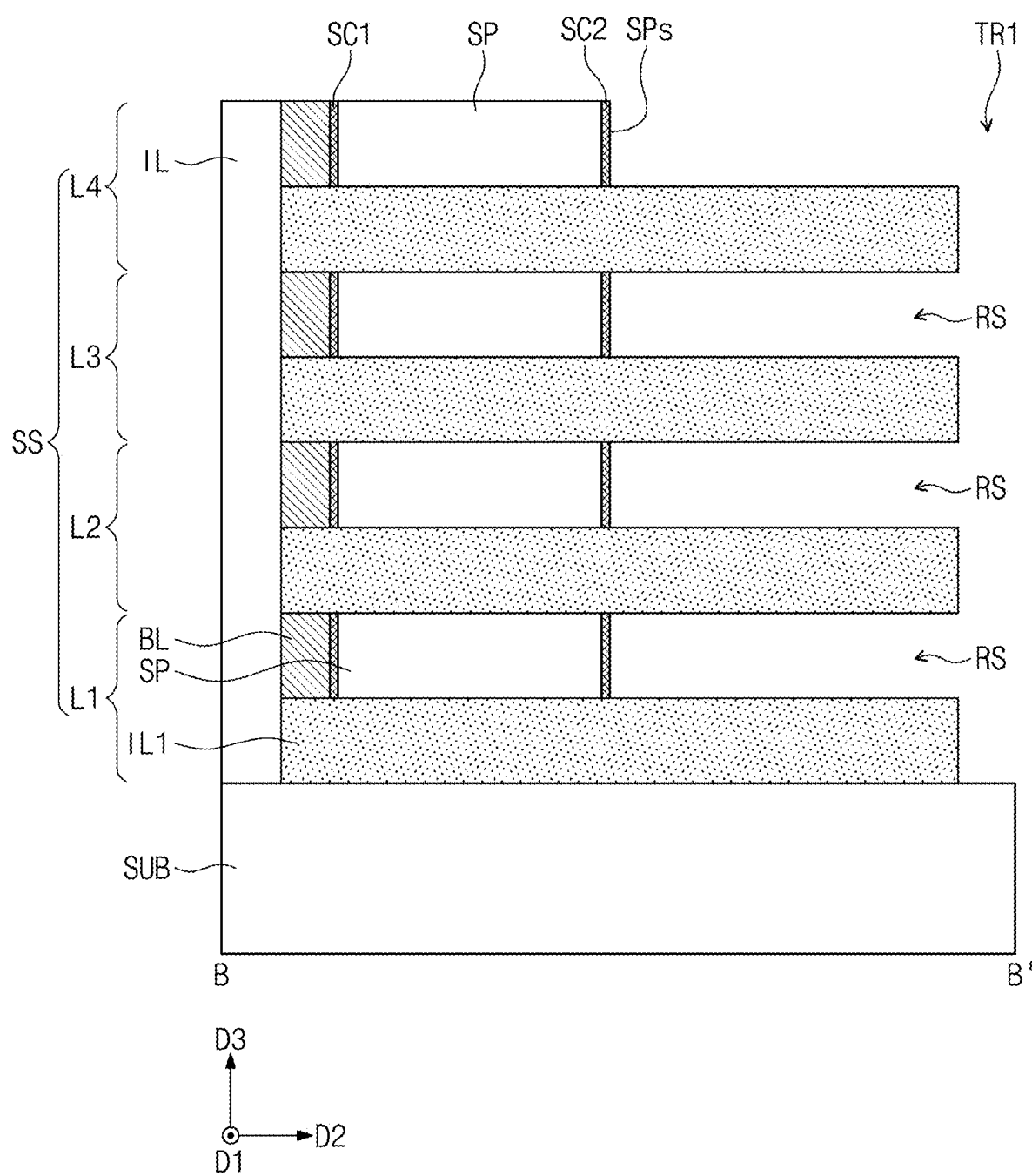

Referring to FIGS. 18, 19A and 19B, the lengths of the semiconductor patterns SP in the second direction D2 may be reduced. The lengths of the semiconductor patterns SP in the second direction D2 may be shortened as compared with the lengths of the first and second insulating patterns IP1 and IP2 in the second direction D2. For example, the reduction of the lengths of the semiconductor patterns SP in the second direction D2 may include performing a wet etching process of selectively etching the semiconductor patterns SP. Since the lengths of the semiconductor patterns SP in the second direction D2 are shorter than the lengths of the first and second insulating patterns IP1 and IP2 in the second direction D2, recess regions RS recessed from the first surface SW in a direction opposite to the second direction D2 may be formed. While the lengths of the semiconductor patterns SP in the second direction D2 are reduced or shortened, portions of the second insulating patterns IP2 may also be removed. Thus, the recess region RS may have a width which increases as a distance from the semiconductor pattern SP increases. The recess regions RS may be defined by top and bottom surfaces of the first insulating patterns IP1, inner side surfaces of the second insulating patterns IP2, and recessed side surfaces of the semiconductor patterns SP.

FIGS. 20A to 20D are enlarged views corresponding to a portion 'B' of FIG. 16 to illustrate a method of forming a recess region, according to some example embodiments of the inventive concepts. The process of forming the recess region RS will be described in more detail with reference to FIGS. 20A to 20D.

Figure 20A:
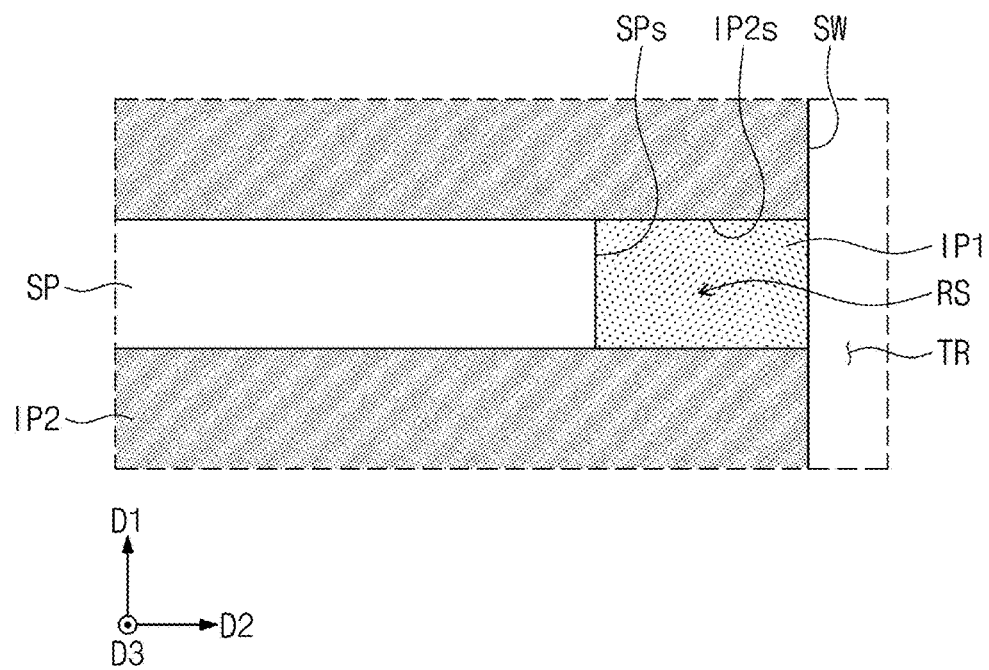
FIGS. 20A to 20D are enlarged views corresponding to a portion 'B' of FIG. 16 to illustrate a method of forming a recess region, according to some example embodiments of the inventive concepts.

Referring to FIG. 20A, a first etching process of etching the semiconductor pattern SP may be performed on the first surface SW of the stack structure SS. The first etching process may be a wet etching process of selectively etching the semiconductor pattern SP among the semiconductor pattern SP, the first insulating pattern IP1 and the second insulating pattern IP2.

A portion of the semiconductor pattern SP may be removed by the first etching process. The recess region RS may be formed in a region from which the semiconductor pattern SP is removed. Since the recess region RS is formed, the top surface of the first insulating pattern IP1 and inner side surfaces IP2s of the second insulating patterns IP2 may be exposed.

Figure 20B:
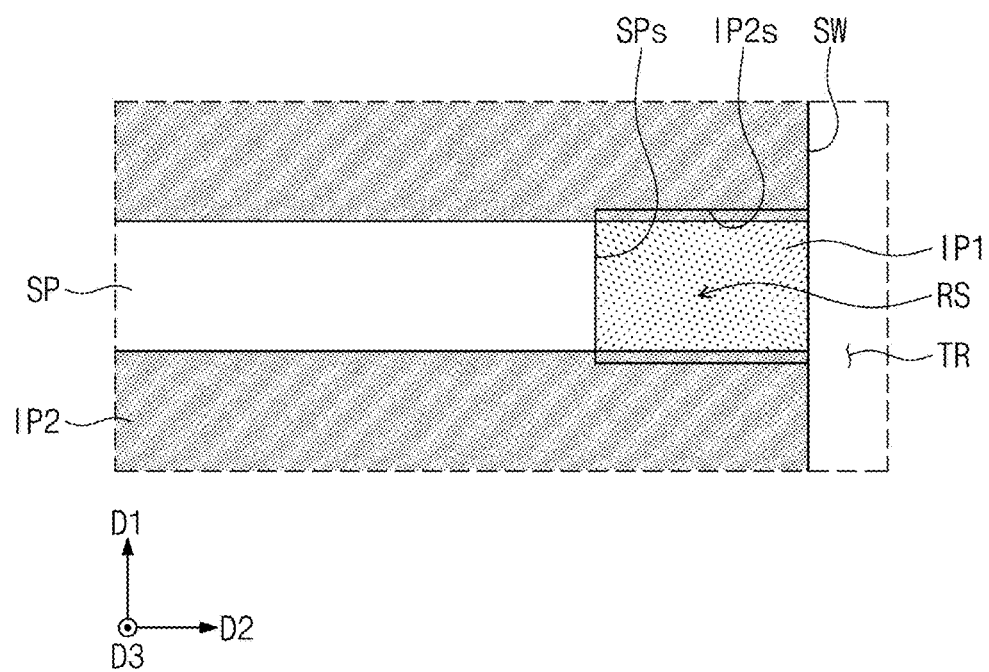

Referring to FIG. 20B, a second etching process of etching the second insulating patterns IP2 may be performed. The second etching process may be a wet etching process of selectively etching the second insulating pattern IP2 among the semiconductor pattern SP, the first insulating pattern IP1 and the second insulating pattern IP2. Portions of the second insulating patterns IP2 may be removed by the second etching process. Thus, a distance between the inner side surfaces IP2s of the second insulating patterns IP2 exposed by the recess region RS may be increased. After performing the second etching process, the distance between the inner side surfaces IP2s of the second insulating patterns IP2 may be greater than a width of the semiconductor pattern SP in the first direction D1.

Figure 20C:
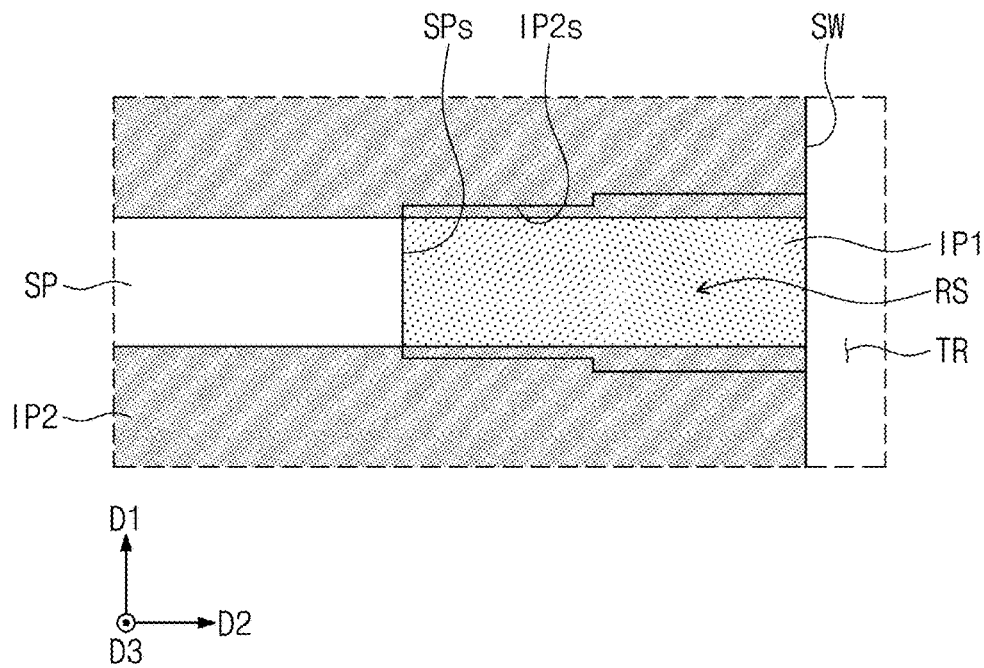

Referring to FIG. 20C, the first etching process and the second etching process may be alternately performed to increase widths of the recess region RS in the first direction D1 and the second direction D2. A length of the semiconductor pattern SP in the second direction D2 may be reduced by the first etching process repeatedly performed, and the distance between the inner side surfaces IP2s of the second insulating patterns IP2 may be increased by the second etching process repeatedly performed. Since the first etching process and the second etching process are alternately performed, the inner side surfaces IP2s of the second insulating patterns IP2 may have stepped shapes.

Figure 20D:
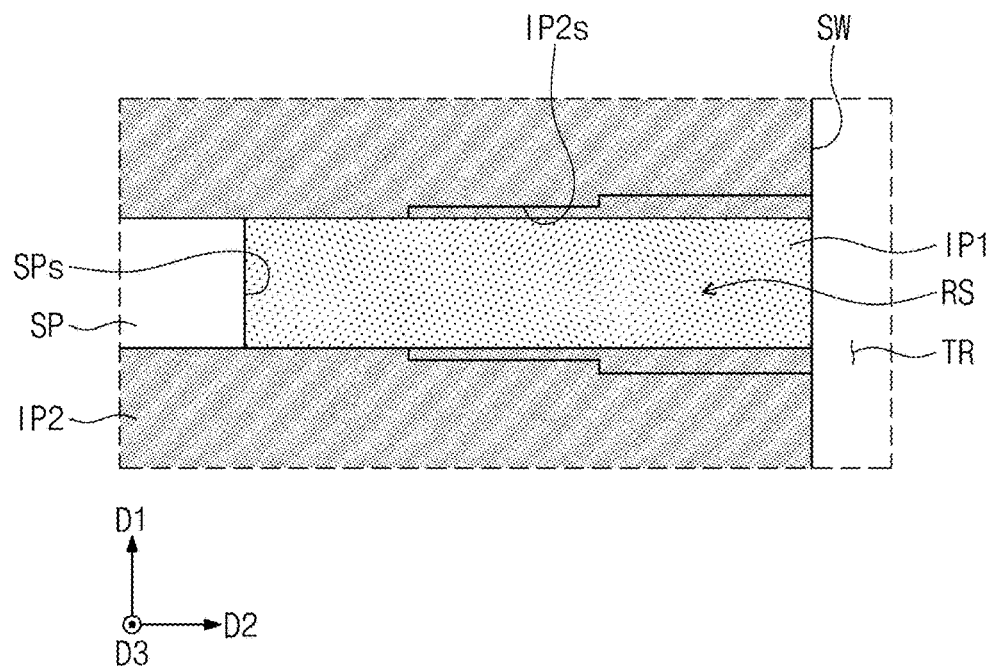

Referring to FIG. 20D, the first etching process may be performed again to partially remove the semiconductor pattern SP. A distance between the inner side surfaces IP2s of the second insulating patterns IP2 adjacent to the semiconductor pattern SP may be equal to the width of the semiconductor pattern SP in the first direction D1.

Referring again to FIGS. 18, 19A and 19B, second dopant regions SD2 may be formed in the semiconductor patterns SP, respectively. The formation of the second dopant regions SD2 may include injecting dopants into the semiconductor patterns SP through exposed side surfaces SPs of the semiconductor patterns SP after the formation of the recess regions RS.

A second silicide pattern SC2 may be formed on the exposed side surface SPs of each of the semiconductor patterns SP. The formation of the second silicide patterns SC2 may include performing a silicidation process on the exposed side surfaces SPs of the semiconductor patterns SP after the formation of the second dopant regions SD2.

Figure 21:
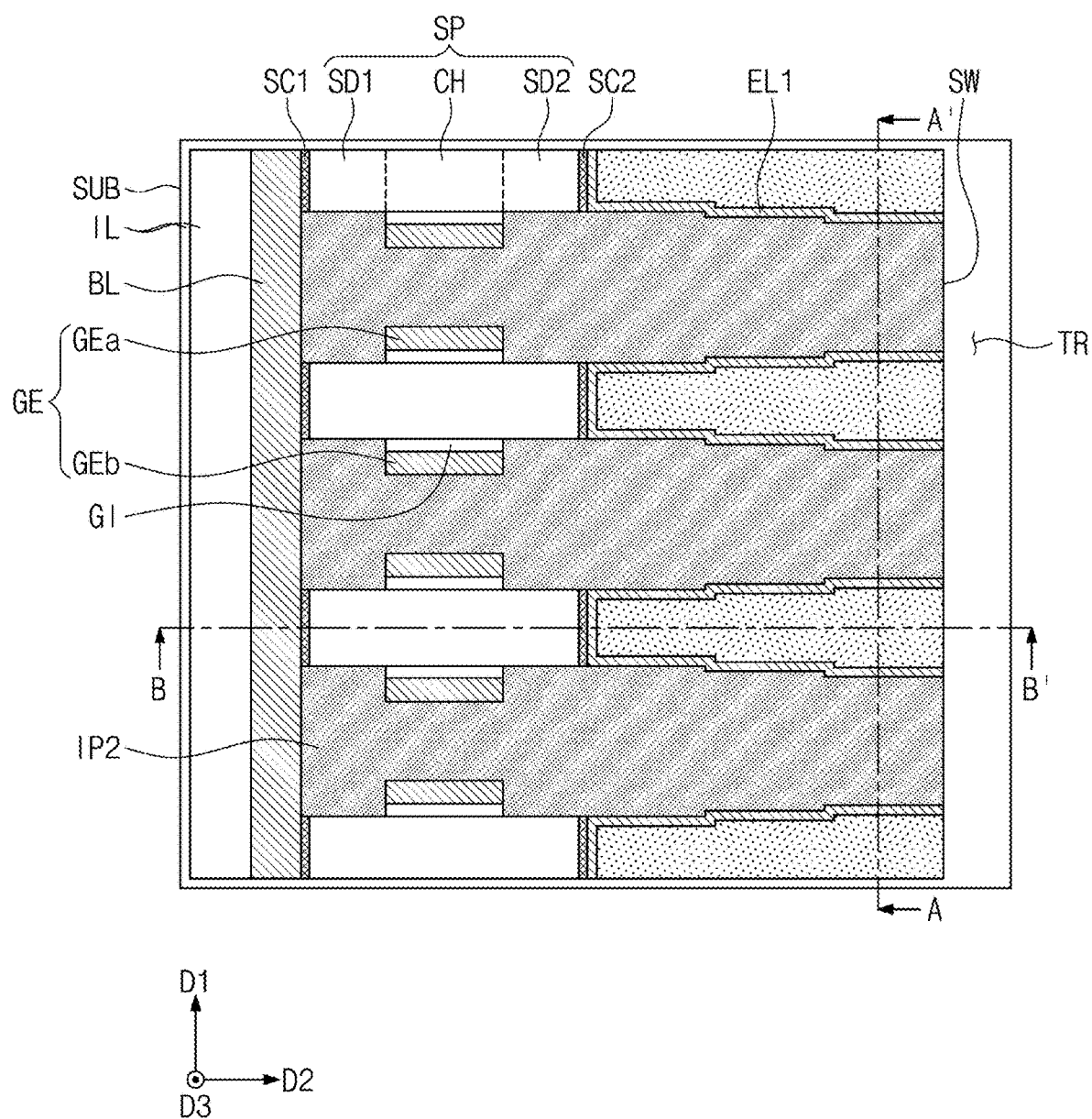
Figure 22A:
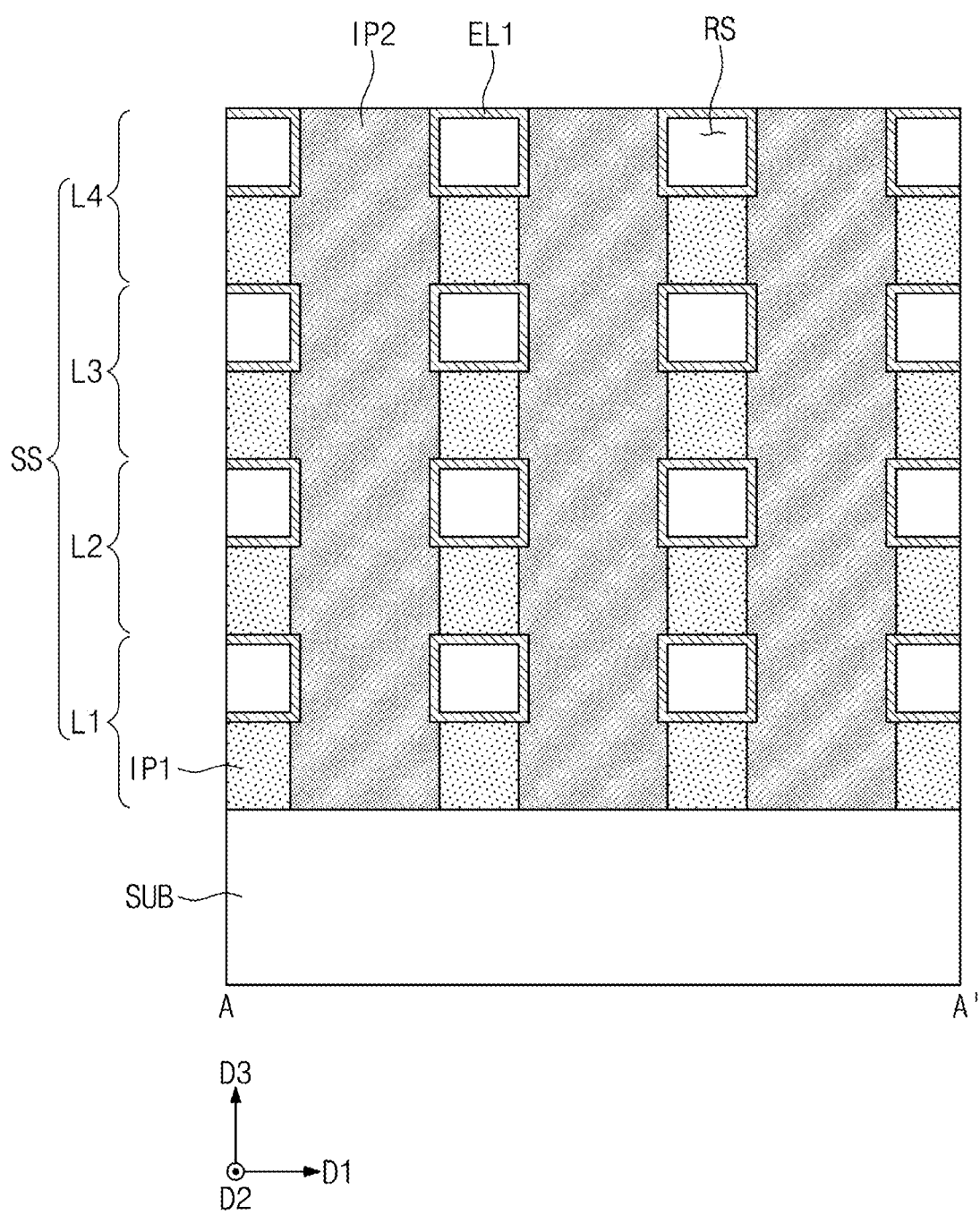
Figure 22B:
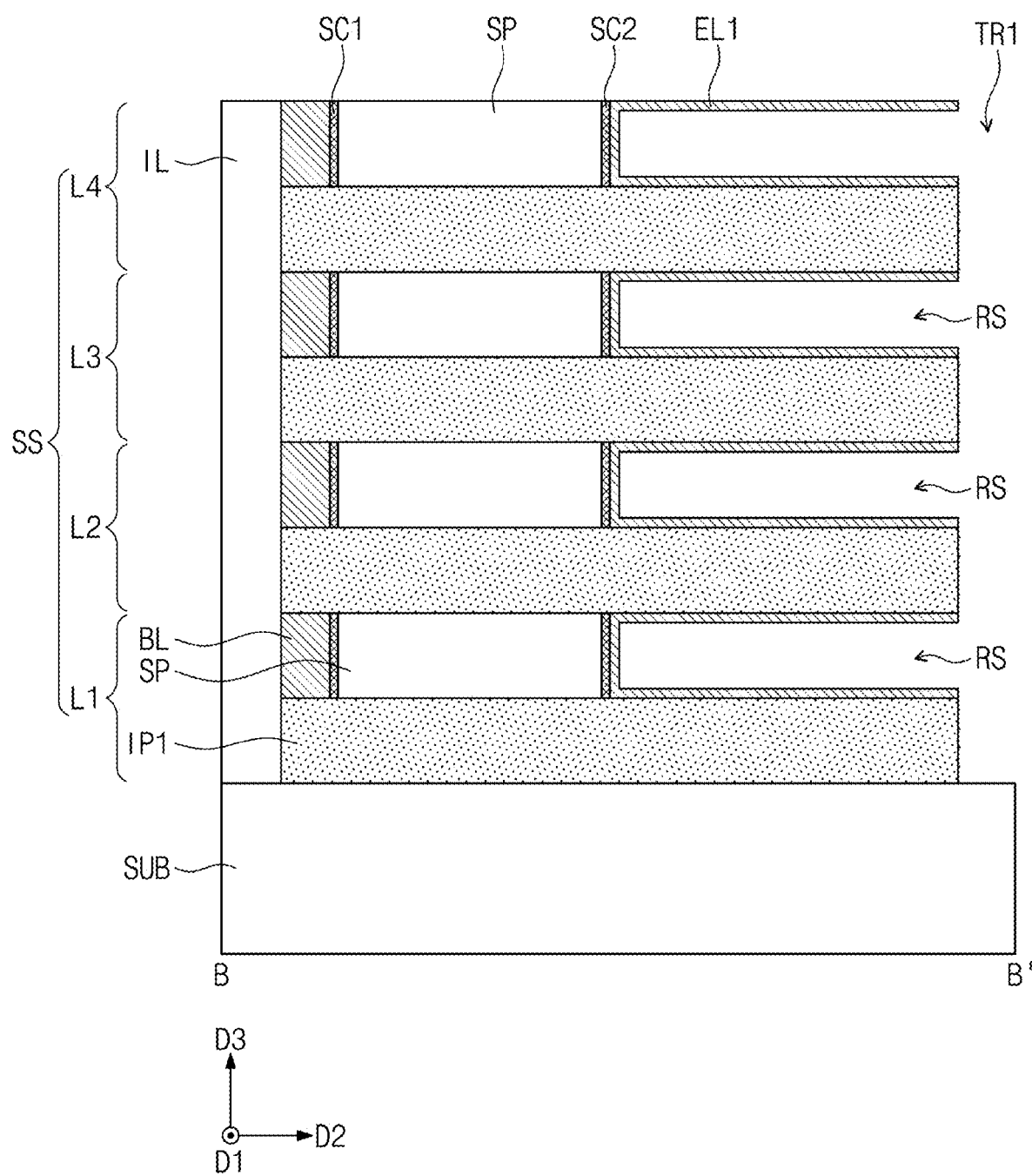

Referring to FIGS. 21, 22A and 22B, first conductive patterns EL1 may be formed in the recess regions RS, respectively. For example, the formation of the first conductive patterns EL1 may include conformally forming a first electrode layer in the recess regions RS, and wet-etching the first electrode layer to divide the first electrode layer into a plurality of the first conductive patterns EL1. Thus, each of the first conductive patterns EL1 may have a cylindrical shape of which one end is opened.

In detail, each of the first conductive patterns EL1 may conformally cover the top surface of the first insulating pattern IP1 disposed thereunder, the bottom surface of the first insulating pattern IP1 disposed thereon, the inner side surfaces of the second insulating patterns IP2, and an end of the semiconductor pattern SP. Since the recess region RS has the width in the first direction D1 which increases as a distance from the semiconductor pattern SP increases, the first conductive pattern EL1 may have a width in the first direction D1 which increases as a distance from the semiconductor pattern SP increases. The top surface of the first insulating pattern IP1 and the bottom surface of the first insulating pattern IP1 which face each other may be parallel to each other. A width of the first conductive pattern EL1 in the third direction D3 may be constant.

Referring again to FIGS. 3 and 4A to 4D, portions of the second insulating patterns IP2 may be removed to expose side surfaces of the first conductive patterns EL1, and then, a dielectric layer DL may be conformally formed on the first conductive patterns EL1. The dielectric layer DL may cover exposed surfaces of the first conductive patterns EL1. A second conductive pattern EL2 may be formed on the dielectric layer DL. The second conductive pattern EL2 may be formed to completely fill the trench TR and the recess regions RS.

In the semiconductor memory device according to some example embodiments of the inventive concepts, the conductive patterns constituting the data storage element may have the widths which increase as a distance from the semiconductor pattern increases. Thus, process defects may be minimized or prevented, and reliability of the semiconductor memory device may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device comprising:
   a bit line extending in a first direction;
   a first conductive pattern extending in a second direction intersecting the first direction;
   a semiconductor pattern connecting the bit line and the first conductive pattern;
   a second conductive pattern including an insertion portion in the first conductive pattern; and
   a dielectric layer between the first conductive pattern and the second conductive pattern,
   wherein the insertion portion of the second conductive pattern has a width which increases as a distance from the width to the semiconductor pattern increases.

2. The semiconductor memory device of claim 1, wherein the first conductive pattern includes: a first portion adjacent to the semiconductor pattern; a second portion having a width greater than that of the first portion; and a stepped portion connecting the first portion and the second portion.

3. The semiconductor memory device of claim 1, further comprising:
   a gate electrode on the semiconductor pattern and extending in a third direction intersecting the first direction and the second direction.

4. The semiconductor memory device of claim 1, further comprising:
   a first silicide pattern between the semiconductor pattern and the bit line; and
   a second silicide pattern between the semiconductor pattern and the first conductive pattern.

5. The semiconductor memory device of claim 1, wherein the semiconductor pattern comprises:
   a first dopant region electrically connected to the bit line;
   a second dopant region electrically connected to the first conductive pattern; and
   a channel region between the first and second dopant regions.

6. The semiconductor memory device of claim 1, wherein the first conductive pattern includes a first portion adjacent to the semiconductor pattern, and a second portion having a width greater than that of the first portion; and a width of the first portion in the first direction is substantially equal to a width of the semiconductor pattern in the first direction.

7. The semiconductor memory device of claim 1, wherein the second conductive pattern further includes an outer portion surrounding at least a portion of the first conductive pattern.

8. The semiconductor memory device of claim 1, wherein the first conductive pattern has a width in the first direction, which increases as a distance from the width to the semiconductor pattern increases.

9. The semiconductor memory device of claim 8, wherein the first conductive pattern has a constant width in a third direction intersecting the first direction and the second direction.

10. The semiconductor memory device of claim 1, wherein the insertion portion has a width in the first direction, which increases as a distance from the width to the semiconductor pattern increases.

11. A semiconductor memory device comprising:
first insulating patterns vertically stacked on a substrate;
semiconductor patterns between the first insulating patterns and arranged in a first direction, the semiconductor patterns extending in a second direction intersecting the first direction;
a bit line electrically connected to first ends of the semiconductor patterns;
first conductive patterns on second ends of the semiconductor patterns, respectively;
a second conductive pattern including portions in the first conductive patterns; and
a dielectric layer between the first conductive patterns and the second conductive pattern, wherein each of the first conductive patterns has a width in the first direction, which increases as a distance from the width of each of the first conductive patterns to a respective one of the semiconductor patterns increases.

12. The semiconductor memory device of claim 11, wherein each of the first conductive patterns includes a first portion adjacent to the semiconductor pattern, and a second portion having a width greater than that of the first portion; and a width of the first portion in the first direction is substantially equal to a width of the semiconductor patterns in the first direction.

13. The semiconductor memory device of claim 11, further comprising:
a gate electrode on the semiconductor patterns and extending in a third direction intersecting the first direction and the second direction.

14. The semiconductor memory device of claim 11, further comprising:
a first silicide pattern between each of the semiconductor patterns and the bit line; and
a second silicide pattern between each of the semiconductor patterns and each of the first conductive patterns.

15. The semiconductor memory device of claim 11, wherein each of the semiconductor patterns comprises:
a first dopant region electrically connected to the bit line;
a second dopant region electrically connected to the first conductive pattern; and
a channel region between the first and second dopant regions.

16. A semiconductor memory device comprising:
a stack structure including a plurality of layers vertically stacked on a substrate, wherein each of the plurality of layers comprises: a bit line extending in a first direction; semiconductor patterns extending from the bit line in a second direction intersecting the first direction; and a first insulating pattern under the semiconductor patterns;
gate electrodes extending in a third direction intersecting the first and second directions and on both side surfaces of each of the semiconductor patterns;
a second insulating pattern filling a space between the semiconductor patterns and covering the gate electrodes;
first conductive patterns electrically connected to the semiconductor patterns, respectively; and
a second conductive pattern spaced apart from the first conductive patterns with a dielectric layer therebetween,
wherein each of the first conductive patterns has a width which increases as a distance from the width of each of the first conductive patterns to a respective one of the semiconductor patterns increases.

17. The semiconductor memory device of claim 16, wherein the first insulating pattern has an etch selectivity with respect to the second insulating pattern.

18. The semiconductor memory device of claim 16, further comprising:
a gate insulating layer between the semiconductor patterns and the gate electrodes.

19. The semiconductor memory device of claim 16, further comprising:
a first silicide pattern between each of the semiconductor patterns and the bit line; and
a second silicide pattern between each of the semiconductor patterns and each of the first conductive patterns.

20. The semiconductor memory device of claim 16, wherein each of the semiconductor patterns comprises:
a first dopant region electrically connected to the bit line;
a second dopant region electrically connected to the first conductive patterns; and
a channel region between the first and second dopant regions and adjacent to the gate electrode.

* * * * *